United States Patent
Hiramatsu

(10) Patent No.: US 8,043,528 B2
(45) Date of Patent: Oct. 25, 2011

(54) LUMINESCENT MATERIAL

(75) Inventor: Ryosuke Hiramatsu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 924 days.

(21) Appl. No.: 12/021,759

(22) Filed: Jan. 29, 2008

(65) Prior Publication Data

US 2009/0023015 A1    Jan. 22, 2009

(30) Foreign Application Priority Data

Jul. 19, 2007   (JP) ................................ 2007-188398

(51) Int. Cl.
C09K 11/02 (2006.01)
H01J 29/10 (2006.01)
H01J 1/62 (2006.01)

(52) U.S. Cl. .................. 252/301.4 R; 313/468; 313/503

(58) Field of Classification Search ........... 252/301.4 R, 252/301.4 F, 301.6 R; 313/467, 468, 486, 313/503
See application file for complete search history.

(56) References Cited

U.S. PATENT DOCUMENTS

| | | | |
|---|---|---|---|
| 2003/0030038 A1* | 2/2003 | Mitomo et al. | 252/500 |
| 2003/0094893 A1* | 5/2003 | Ellens et al. | 313/503 |
| 2006/0017041 A1* | 1/2006 | Tian et al. | 252/301.4 F |
| 2009/0091237 A1* | 4/2009 | Hirosaki et al. | 313/504 |

FOREIGN PATENT DOCUMENTS

| | | |
|---|---|---|
| JP | 2003-096446 | 4/2003 |
| JP | 2005-112922 | 4/2005 |
| JP | 2008069198 | 3/2008 |
| WO | WO 2007004493 A1 * | 1/2007 |
| WO | 2008/086855 | 7/2008 |

OTHER PUBLICATIONS

J.W.H. Van Krevel, On New Rare-Earth Doped M-Si-Al-O-N Materials luminescence properties and oxidation resistance, Jan. 27, 2000, Chapter 4 and 5, pp. 43-69.*
J.W.H. Van Krevel, On New Rare-earth Doped M-Si-Al-O-N Materials, luminescence properties and oxidation resistance, Jan. 27, 2000.
Japanese Office Action dated Jul. 28, 2009 corresponding to U.S. Appl. No. 12/021,759, filed Jan. 29, 2008.
European Search Report mailed on Nov. 6, 2008 corresponding to U.S. Appl. No. 12/021,759, filed Jan. 29, 2008.
Materials Research Bulletin 35 (2000) 747-754.
Journal of Alloys and Compounds 268 (1998) 272-277.

* cited by examiner

Primary Examiner — Jerry A Lorengo
Assistant Examiner — Lynne Edmondson
(74) Attorney, Agent, or Firm — Turocy & Watson, LLP

(57) ABSTRACT

A luminescent material is provided, which comprises a crystalline phase including Y, Si, O and N, and an activator comprising Tb and Ce.

17 Claims, 11 Drawing Sheets

__US 8,043,528 B2__

LUMINESCENT MATERIAL

CROSS-REFERENCE TO RELATED APPLICATIONS

This application is based upon and claims the benefit of priority from prior Japanese Patent Application No. 2007-188398, filed Jul. 19, 2007, the entire contents of which are incorporated herein by reference.

BACKGROUND OF THE INVENTION

1. Field of the Invention

This invention relates to a luminescent material and also to a light-emitting device.

2. Description of the Related Art

A light-emitting diode (LED) is generally constituted by a combination of an LED chip acting as an excitation light source with a luminescent material and emits various luminescent colors depending on the combination. In the case of a white LED device which emits white light, there is employed a combination of an LED chip which emits light having a wavelength ranging from 360 to 500 nm with a luminescent material. For example, there is employed a combination of an LED chip which is capable of emitting light in the ultraviolet or near-ultraviolet region with a mixture of luminescent materials. This mixture of luminescent materials may be composed of a blue luminescent material, a green or yellow luminescent material and a red luminescent material. It is required that the luminescent material to be used in a white LED device is not only capable of effectively absorbing the light ranging from the near-ultraviolet to blue regions, i.e., a wavelength of 360-500 nm which corresponds to the emission wavelength of the LED chip acting as an excitation light source but also capable of efficiently emitting visible light. However, these white LEDs are used in combination with a luminescent material exhibiting a wideband emission spectrum having a half band width of 80 nm or more. For this reason, the white LEDs are limited in color rendering and emission efficiency.

JP-A 2003-96446 (KOKAI) describes a Ce-activated yttrium silicon oxynitride luminescent material. This luminescent material is formed of a composition represented by $Y_2Si_3O_3N_4$:Ce.

Although they do not belong to yttrium silicon oxynitride, a Tb-activated $La_3Si_8O_4N_{11}$ luminescent material and a Tb-activated $La_3Si_{8-x}Al_xO_{4-x}N_{11+x}$ luminescent material are proposed in JP-A 2005-112922 (KOKAI). According to these luminescent materials, the practical excitation band of $Tb^{3+}$ is limited to the range from the excitation spectrum shown in the drawing to an ultraviolet region in the vicinity of about 300 nm. For this reason, even if a light-emitting element which emits light ranging from near-ultraviolet to the blue region is employed as a light source, it would be almost impossible to obtain the emission of light.

Further, in the case of the ultraviolet LED, since the wavelength of light to be emitted therefrom is too short to use for illumination, the resin in which the luminescent material is dispersed would be prominently degraded. Moreover, the ultraviolet LED which emits light having a wavelength of about 300 nm is accompanied by problems that the manufacturing cost thereof is higher than that of the LED chip which emits light having a wavelength ranging from 370 to 440 nm and that the conversion efficiency of electricity into light is low.

BRIEF SUMMARY OF THE INVENTION

A luminescent material according to one aspect of the present invention comprises a crystal phase containing Y, Si, O and N; and an activator containing Tb and Ce.

A luminescent material according to another aspect of the present invention comprises a crystalline phase including Y, Si, O, N and M, M being at least one selected from a group consisting of La, Gd and Lu; and an activator comprising Tb and Ce.

A light-emitting device according to one aspect of the present invention comprises a light-emitting element emitting light, the light having a main emission peak in a wavelength ranging from 360 to 460 nm; and a luminescent layer comprising a first luminescent material and configured to be irradiated with the light, the first luminescent material being formed of the above mentioned luminescent material.

DETAILED DESCRIPTION OF THE INVENTION

Figure 1:
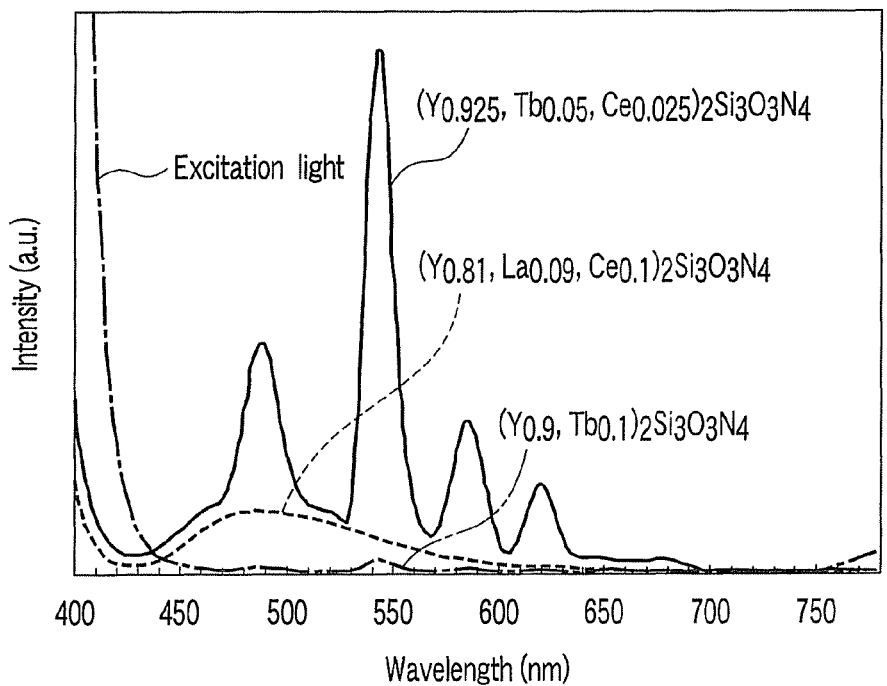
FIG. 1 is a graph showing an emission spectrum of the conventional luminescent material and an emission spectrum of the luminescent material according to one embodiment.

Next, embodiments will be explained. The embodiments described below are simply examples of the luminescent materials and the light-emitting devices each embodying the technical concept of the present invention, so that the present invention should not be construed as being limited to the following embodiments.

Further, the members described in the claims accompanied herewith should not be construed as being limited to those described in the following embodiments. The dimensions, specific materials, configurations and relative arrangement of the constituent members described in the following embodiments are set forth merely for the purpose of explanation and hence should not be construed as limiting the scope of the present invention. It should be noted that the size and relative position of the members shown in the drawings are exaggerated in some cases for the convenience of explanation.

In the following explanations, the same or like members are identified by the same designation or the same symbol, thereby omitting the repetition of detailed explanation thereof. Further, each of elements constituting the embodiment of the present invention may be modified in such a manner that a plurality of elements are integrated by the same and single member to enable this single member to have the functions of the plurality of elements or, on the contrary, the functions of a single member are shared by a plurality of members.

As a result of extensive studies made by the present inventors, it has been found that a luminescent material containing yttrium silicon oxynitride emits light as it is excited by the light having a main luminescence peak falling within a wavelength range of 360 to 460 nm. In this specification, the term "yttrium silicon oxynitride luminescent material" means a luminescent material having a crystal phase containing Y, Si, O and N. Since this luminescent material contains a specific kind of activator, the luminescent material according to one embodiment emits light as it is excited by the light having a luminescence peak falling within a wavelength range of 360 to 460 nm.

This yttrium silicon oxynitride luminescent material can be represented generally by formula B, below.

$$Y_a Si_b O_c N_d \quad (B)$$

Since "a", "b", "c" and "d" can be regarded as being substantially stoichiometric composition ratio as long as they are confined to the range shown below, there is no possibility that the emission efficiency can be prominently reduced. It should be noted that accurate stoichiometric composition ratio of these subscripts is: a=2, b=3, c=3 and d=4.

$$1.9 \leq a \leq 2.1 \quad (3);$$

$$2.8 \leq b \leq 3.1 \quad (4);$$

$$2.7 \leq c \leq 3.1 \quad (5);$$

$$3.8 \leq d \leq 4.2 \quad (6);$$

The luminescent material according to one embodiment comprises yttrium silicon oxynitride luminescent material as a crystal phase, and terbium and cerium as an activator. Since the luminescent material contains cerium together with terbium, the yttrium silicon oxynitride luminescent material according to one embodiment exhibits a narrowband emission spectrum of $Tb^{3+}$ at a specific wavelength region as it is excited by the light having a luminescence peak falling within a wavelength range of 360 to 460 nm. This phenomenon was first discovered by the present inventors.

The ultraviolet-emitting LED which emits light having a short wavelength of less than 360 nm is high in manufacturing cost and low in conversion efficiency of electricity to light. Moreover, since the resin in which the luminescent material is dispersed tends to be prominently degraded, the lower limit of excitation wavelength is practically confined to 360 nm. On the other hand, if this LED is excited by light having a wavelength of more than 460 nm, it is scarcely possible to obtain a narrowband emission spectrum of $Tb^{3+}$, so that the upper limit of excitation wavelength is confined to 460 nm.

The narrowband emission spectrum is an emission band originating from $^5D_4 \rightarrow ^7F_J$ (J=6, 5, 4, 3) transition of $Tb^{3+}$. Since this emission band is the emission of light resulting from the 4f-4f transition which is shielded from exterior, the influence thereof on aspects of the peripheral environment, such as constituent elements and crystal structure, is minimal, allowing a value substantially inherent to the ion to be taken. Therefore, a peak of the narrowband emission spectrum appears in wavelength regions of 480-495, 540-550, 570-590, and 610-630 nm. A luminescent material according to one embodiment exhibits a peak of the narrowband emission spectrum of $Tb^{3+}$ in at least one of the aforementioned wavelength regions as it is excited by light having a peak wavelength in a wavelength region ranging from near-ultraviolet region to blue light region, i.e., light having an emission peak in the wavelength region of 360-460 nm. Further, even though it may be small as compared with the emission of terbium, it is possible to confirm a wideband emission of $Ce^{3+}$ having a peak intensity in wavelength in the vicinity of 470-500 nm.

It should be noted that by the term "narrowband emission spectrum", it is intended to mean a spectrum of the narrowband emission wherein a half bandwidth of the emission band to be measured is confined within 50 nm. This emission spectrum can be determined by exciting a luminescent material with light having an emission peak in a wavelength region of 360-460 nm to generate the emission of light, which is measured by a spectrophotometer, thus determining the emission spectrum. As the excitation source, it is possible to employ, for example, a near-ultraviolet-region LED which emits light of wavelength 390 nm or a blue-region LED which emits light of wavelength 460 nm. As the spectrophotometer, it is possible to employ, for example, an IMUC-7000G (trade name, OTSUKA ELECTRONICS Co., LTD.).

The yttrium silicon oxynitride luminescent material according to one embodiment can be represented generally by the formula A1, below.

$$(Y_{1-x1-y1}, Tb_{x1}, Ce_{y1})_a Si_b O_c N_d \quad (A1)$$

In the formula A1, x1 and y1 are all greater than zero. In the case where x1=0, i.e., Tb is not included therein, even if the luminescent material is excited by light having an emission peak falling within the range of 360-460 nm, the emission to be obtained would be only a wideband emission of $Ce^{3+}$. The narrowband emission originating from $Tb^{3+}$ cannot be obtained. On the other hand, in the case where y1=0, i.e., Ce is not included therein, when the luminescent material is excited by light having an emission peak falling within the range of 360-460 nm, the narrowband emission originating from $Tb^{3+}$, i.e., wavelength regions of 540-550, 570-590 and 610-630 nm, would become very small. In order to obtain the narrowband emission originating from $Tb^{3+}$ when the luminescent material is excited by light having an emission peak falling within the range of 360-460 nm, not only Tb but also Ce is required to be included as an essential activator in the luminescent material according to the embodiment.

When the content x1 of Tb is excessively large, a concentration quenching phenomenon generates, thereby possibly decreasing the emission intensity of the $(Y_{1-x1-y1}, Tb_{x1}, Ce_{y1})_a Si_b O_c N_d$ luminescent material. If the content x1 is 0.6 or less, the aforementioned problem can be obviated. The content x1 should preferably be confined to the range of $0.05 \leq x1 \leq 0.4$.

Even in the case where the content y1 of Ce is excessively large, a concentration quenching generates, thereby possibly reducing the emission intensity of the $(Y_{1-x1-y1}, Tb_{x1}, Ce_{y1})_a Si_b O_c N_d$ luminescent material. If the content y1 is 0.2 or less, the aforementioned problem can be obviated. Further, since the ionic radius of $Ce^{3+}$ is larger than that of $Y^{3+}$ and $Tb^{3+}$, it is more likely that, inherently, $Ce^{3+}$ can hardly be enabled to activate the $Y_2Si_3O_3N_4$ matrix. The content y1 should preferably be confined to the range of $0.005 \leq y1 \leq 0.1$.

Further, in order to efficiently obtain the narrowband emission of terbium, the Tb-activating quantity should preferably be larger than the Ce-activating quantity. For example, as long as x1/y1 is confined to the range of 1-100 or thereabouts, the effects to be derived from Tb can be more apparently exhibited. More preferably, x1/y1 should be confined to the range of 2-80.

In the luminescent material having a composition represented by the formula A1, when a trivalent cation selected from lanthanum, gadolinium and lutetium is substituted for the Y-site, the narrowband emission of terbium can be increased. This luminescent material can be represented by formula A2, below.

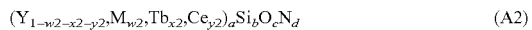

$$(Y_{1-w2-x2-y2}, M_{w2}, Tb_{x2}, Ce_{y2})_a Si_b O_c N_d \quad (A2)$$

In the formula A2, M is selected from La, Gd and Lu; w2, x2 and y2 are all larger than 0. In this case, Y and M (M is at least one selected from La, Gd and Lu) exist therein in a state of complete solid solution. Because of the reason that the narrowband emission of terbium can be prominently increased, the employment of lanthanum is more preferable for M.

As long as the content w2 of M is 0.01 or more, it is possible to sufficiently secure the effects of increasing the emission intensity. Since the ionic radius of the element to be included as M such as lanthanum differs greatly from the ionic radius of yttrium, the content of M is limited such that the upper limit of w2 is confined to 0.3 or thereabouts. Preferably, the content of w2 should be confined to the range of $0.04 \leq w2 \leq 0.3$, more preferably the range of $0.04 \leq w2 \leq 0.2$.

The term x2 in the formula A2 corresponds to x1 in the formula A1. For the same reasons as in the case of x1, x2 should preferably be confined to the range of $0 < x2 \leq 0.6$, more preferably the range of $0.05 \leq x2 \leq 0.4$. The term y2 in the formula A2 corresponds to y1 in the formula A1. For the same reasons as in the case of y1, y2 should preferably be confined to the range of $0 < y2 \leq 0.2$, more preferably the range of $0.005 \leq y2 \leq 0.1$. For the same reasons as with x1/y1, as long as x2/y2 is confined to the range of 1-100 or thereabouts, the effects to be derived therefrom can be more apparently exhibited. More preferably, x2/y2 should be confined to the range of 2-80.

The content of each of these elements in the luminescent material according to the embodiment can be analyzed, for example, by the following procedures. In the analysis of metal element such as Y, M, Tb, Ce and Si, the luminescent material synthesized is subjected to alkali fusion. The fused material thus obtained is then subjected to analysis by ICP emission spectrochemical method which is an internal standard method and by SPS1200AR (trade name, SII Nanotechnology Inc.) for example. Further, in the analysis of non-metal element "O", the synthesized luminescent material is subjected to inert gas fusion. The fused material is then analyzed by infrared absorption method using, for example, TC-600 (trade name, LECO Co., Ltd.). In the analysis of non-metal element "N", the synthesized luminescent material is subjected to inert gas fusion. The fused material is then analyzed by thermal conductivity method using, for example, TC-600 (trade name, LECO Co., Ltd.). In this manner, the composition of the luminescent material can be determined.

The luminescent material according to the embodiment as described above can be combined with a light-emitting element having an emission peak falling within a wavelength region of 360-460 nm to obtain an LED light-emitting device representing another embodiment. Since an yttrium silicon oxynitride luminescent material containing a specific activator is included in the emission layer, the LED light-emitting device according to this embodiment can increase the emission efficiency and color rendering as compared with an LED light-emitting device using a conventional luminescent material.

The luminescent material according to the embodiment can be manufactured by employing the following method for example. As the starting material, it is possible to employ the oxide powder or nitride powder of the constituent elements. A starting material is weighed to obtain a predetermined quantity thereof to which a crystal growth-promoting agent is added and mixed together by, for example, a ball mill, etc. As the raw material for Y, it is possible to employ, for example, $Y_2O_3$ and YN. As the raw material for Si, it is possible to employ, for example, $SiO_2$ and $Si_3N_4$. As the raw material for Tb, it is possible to employ, for example, $Tb_4O_7$ and TbN. As the raw material for Ce, it is possible to employ, for example, $CeO_2$ and CeN. Further, as the raw material for La, it is possible to employ, for example, $La_2O_3$ and LaN. As the raw material for Gd, it is possible to employ, for example, $Gd_2O_3$ and GdN. As the raw material for La, it is possible to employ, for example, $Lu_2O_3$ and LuN.

Starting materials such as oxides are formulated in conformity with the composition ratio of the compound aimed at. These raw material powders can be mixed together by dry mixing method wherein any solvent is not employed. Alternatively, it is also possible to employ a wet mixing method wherein an organic solvent such as ethanol is employed.

In the synthesis of a nitride luminescent material or an oxynitride luminescent material according to the prior art, it has been considered imperative to employ a nitride raw material. For example, in the case of a $CaAlSiN_3$:Eu luminescent material, $Ca_2N_3$, AlN and EuN are employed as raw materials for the synthesis of the luminescent material. Since the powder of these raw materials are anaerobic, it is required, when weighing and mixing these powders in the synthesis of these luminescent materials, to perform the synthesis of luminescent material under an environment shielded from air atmosphere (steam), e.g., in a gloved box for example. Whereas in the case of the luminescent material according to one embodiment, the synthesis of these luminescent materials can be achieved by raw materials such as $Y_2O_3$, $La_2O_3$, $Si_3N_4$, $Tb_4O_7$ and $CeO_2$. These raw materials are excellent in stability, far exceeding the stability of $Ca_2N_3$, under an environment of air atmosphere (steam). It is possible, through the employment of these raw materials, to perform the weighing and mixing thereof in air atmosphere. Accordingly, the luminescent material according to the embodiment can be manufactured by a synthesizing device which is very convenient and inexpensive, thereby making it possible to greatly reduce the manufacturing cost thereof.

As the crystal growth-promoting agent, it is possible to employ the chlorides, fluorides, bromides or iodides of ammonium such as ammonium chloride. It is also possible to employ the chlorides, fluorides, bromides or iodides of alkaline metals. Further, it is also possible to employ the chlorides, fluorides, bromides or iodides of alkaline earth metals. In order to prevent any increase in hygroscopic property of the crystal growth-promoting agent, the content of these crystal growth-promoting agents should preferably be confined to the range of 0.01 to 0.3 wt % based on the total weight of these raw material powders.

A mixed raw material obtained from the mixing of these raw material powders is placed in a vessel such as a crucible and then subject to heat treatment to obtain a sintered product. The heat treatment can be performed in a $N_2$ or $N_2/H_2$ atmosphere. By performing the heat treatment in these atmospheres, it is possible to prevent any increase in hygroscopic property of the raw materials and to synthesize a matrix of luminescent material and, at the same time, it is possible to promote the reduction of terbium and cerium in the oxides employed as raw materials. The conditions for the heat treatment should preferably be 1600-1900° C. in temperature and 1-5 hours in treatment time. When the treatment temperature is too low or when the treatment time is too short, it may become difficult to sufficiently achieve the reaction of raw material powders. On the other hand, when the treatment temperature is too high or when the treatment time is too long, the sublimation of raw material powders or the product may occur.

The sintering pressure should preferably be not lower than atmospheric pressure or, more preferably, 5 atm. or more in order to suppress the decomposition of silicon nitride. The sintered product thus obtained may be subsequently pulverized to obtain the powder thereof, which is again placed in a vessel and subjected to secondary sintering in a $N_2$ or $N_2/H_2$ atmosphere. As the pulverization on the occasion secondary sintering, there is not any particular regulation, so that the blocks of product of primary sintering may be pulverized in a mortar, etc., so as to increase the surface area thereof.

By the aforementioned method, a $(Y_{0.81}, La_{0.09}, Tb_{0.1})_2Si_3O_3N_4$ luminescent material, wherein the concentration of Tb was: x2=0.1 and the concentration of Ce was: y2=0, was manufactured. Since Ce was not included in this luminescent material among Tb activator and Ce activator, this luminescent material is of the prior art. Further, a $(Y_{0.81}, La_{0.09}, Ce_{0.1})_2Si_3O_3N_4$ luminescent material, wherein the concentration of Tb was: x2=0 and the concentration of Ce was: y2=0.1, was manufactured. Since Tb was not included in this luminescent material among Tb activator and Ce activator, this luminescent material is of the prior art. Further, a $(Y_{0.925}, Tb_{0.05}, Ce_{0.025})_2Si_3O_3N_4$ luminescent material, wherein the concentration of Tb was: x1=0.05 and the concentration of Ce was: y1=0.025, was manufactured. Since Tb activator and Ce activator were both included in this luminescent material, this luminescent material is of the present embodiment.

The luminescent materials thus obtained were excited by a near-ultraviolet LED exhibiting a wavelength of 389 nm to measure the emission spectrum thereof. The results are shown in FIG. 1. As shown in FIG. 1, it was possible to derive from the $(Y_{0.81}, La_{0.09}, Tb_{0.1})_2Si_3O_3N_4$ luminescent material and the $(Y_{0.925}, Tb_{0.05}, Ce_{0.025})_2Si_3O_3N_4$ luminescent material a narrowband emission spectrum originating from $Tb^{3+}$ and exhibiting a peak wavelength of 545 nm. However, the peak intensity of the $(Y_{0.81}, La_{0.09}, Tb_{0.1})_2Si_3O_3N_4$ luminescent material was only 4% of that of the $(Y_{0.925}, Tb_{0.05}, Ce_{0.025})_2Si_3O_3N_4$ luminescent material.

It will be recognized from these results that the peak intensity of the $(Y_{0.81}, La_{0.09}, Tb_{0.1})_2Si_3O_3N_4$ luminescent material obtained through near-ultraviolet excitation was quite insufficient to be practicable. Further, it was possible to derive from the $(Y_{0.81}, La_{0.09}, Ce_{0.1})_2Si_3O_3N_4$ luminescent material only a wideband emission spectrum originating from $Ce^{3+}$ and exhibiting a peak wavelength of 485 nm.

Generally, in the case of the luminescent material which has been activated by terbium, the excitation light is absorbed by the 4f-5d transition of $Tb^{3+}$ and the emission of light generates through the 4f-4f transition. In the case where excitation light exhibiting a peak intensity at a long wavelength of 254 nm or more is employed, since the absorption band (excitation band) of $Tb^{3+}$ does not exist in the aforementioned wavelength range, the excitation light can be scarcely absorbed by the luminescent material, thus making it impossible to generate the emission of light.

Whereas, in the case of the luminescent material according to this embodiment where the luminescent material is activated by Tb and Ce, when excitation light exhibiting a peak intensity at a long wavelength of 254 nm or more such as the wavelength range of near-ultraviolet to blue is employed for the irradiation, the excitation light absorbed by the $Ce^{3+}$ of the matrix and the energy thus absorbed is then transferred to the $Tb^{3+}$. As a result, it is possible to derive the emission of $Tb^{3+}$. Namely, the $Ce^{3+}$ acts as a sensitizer for the double activated luminescent material, permitting energy transmission to occur through the resonance transfer process of $Ce^{3+} \rightarrow Tb^{3+}$, thereby making it possible to derive the emission of $Tb^{3+}$.

Further, a $(Y_{0.833}, La_{0.092}, Tb_{0.05}, Ce_{0.025})_2Si_3O_3N_4$ luminescent material, a $(Y_{0.833}, Gd_{0.092}, Tb_{0.05}, Ce_{0.025})_2Si_3O_3N_4$ luminescent material, and a $(Y_{0.742}, Lu_{0.083}, Tb_{0.15}, Ce_{0.025})_2Si_3O_3N_4$ luminescent material were manufactured respectively according to the aforementioned method. The luminescent materials thus obtained were excited by a near-ultraviolet LED exhibiting a peak wavelength of 391 nm and the emission spectrums thus obtained were measured. The results are shown in FIGS. 2 and 3, respectively.

Figure 2:
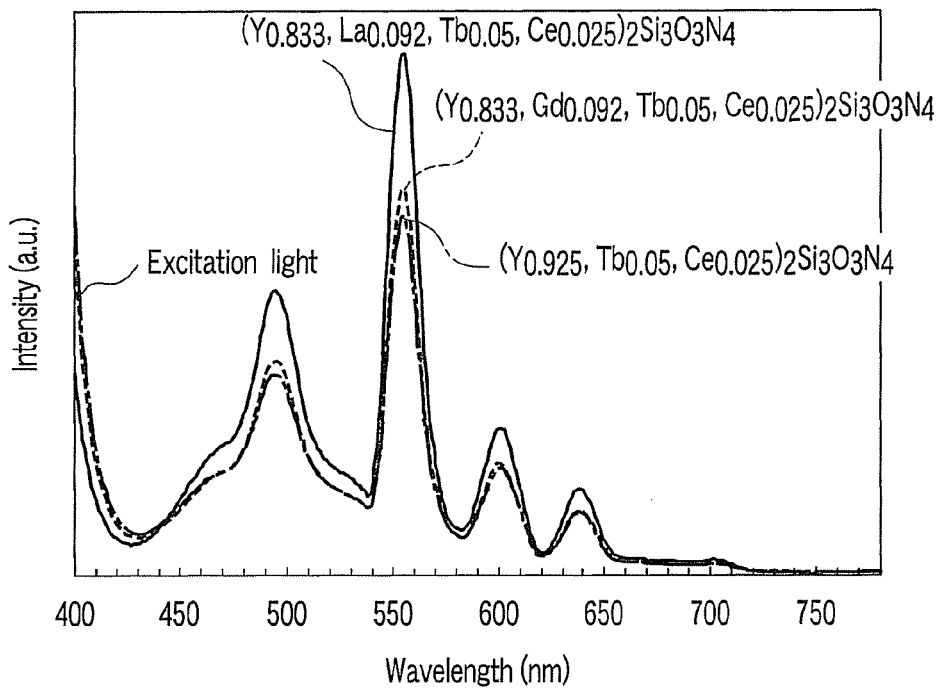
FIG. 2 shows an emission spectrum of the luminescent material according to another embodiment.
Figure 3:
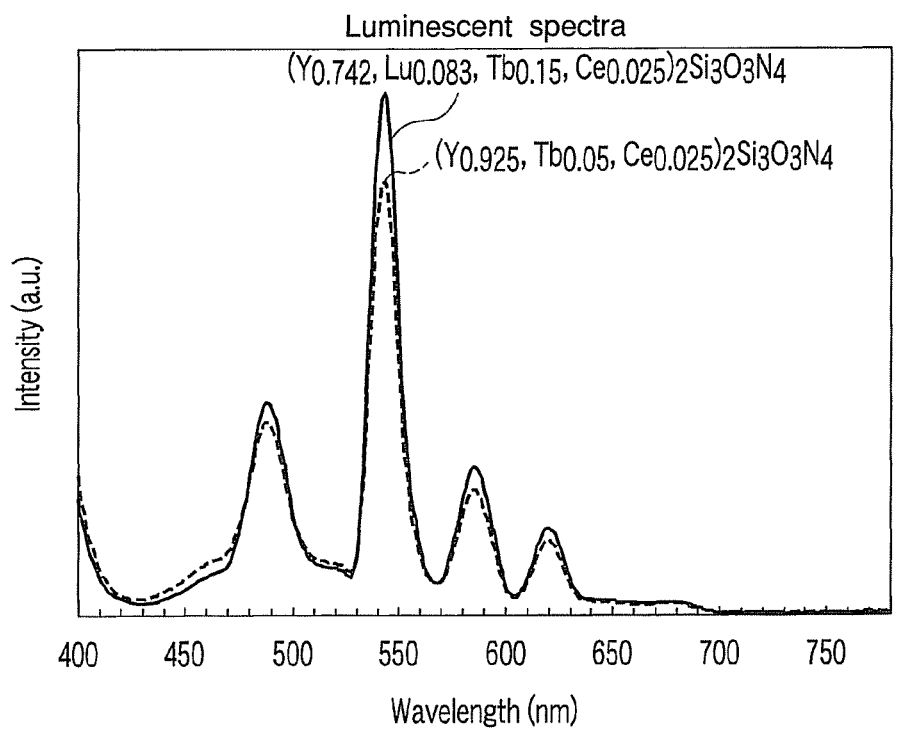
FIG. 3 shows an emission spectrum of the luminescent material according to further embodiment.

As shown in FIG. 2, it was possible, through near-ultraviolet excitation, to derive from the $(Y_{0.833}, La_{0.092}, Tb_{0.05}, Ce_{0.025})_2Si_3O_3N_4$ luminescent material and the $(Y_{0.833}, Gd_{0.092}, Tb_{0.05}, Ce_{0.025})_2Si_3O_3N_4$ luminescent material an emission originating from $Tb^{3+}$ and exhibiting a peak wavelength of 545 nm. Further, as shown in FIG. 3, it was possible to derive from the $(Y_{0.742}, Lu_{0.083}, Tb_{0.15}, Ce_{0.025})_2Si_3O_3N_4$ luminescent material also an emission originating from $Tb^{3+}$ and exhibiting a peak wavelength of 545 nm. It will be recognized from the results shown in FIGS. 2 and 3 that if the $Y_2Si_3O_3N_4$ matrix is to be co-activated with Tb and Ce, the incorporation of rare earth elements such as La, Gd and Lu in the matrix is useful in increasing the emission intensity.

Especially, in the case of the $(Y_{0.833}, La_{0.092}, Tb_{0.05}, Ce_{0.025})_2Si_3O_3N_4$ luminescent material wherein La was added thereto, it was possible to increase the emission intensity up to about 1.5 times as high as that of the sample where La was not incorporated. It was assumed that this increase of emission intensity could be attributed to the element La being closest in nature to alkaline earth metals among the rare earth elements and hence higher in reactivity. Namely, it is conceivable that La exhibits almost the same effects as a flux, so that the luminescent material incorporated with La was enabled to increase the crystallinity thereof and hence the emission intensity. Furthermore, as one of the reasons for the increase of emission intensity, it may be also attributed to the fact that since La is larger in ionic radius than that of Y or Tb, the incorporation of La was effective in diminishing the defectives or strains in the crystal lattice of luminescent material.

Figure 4:
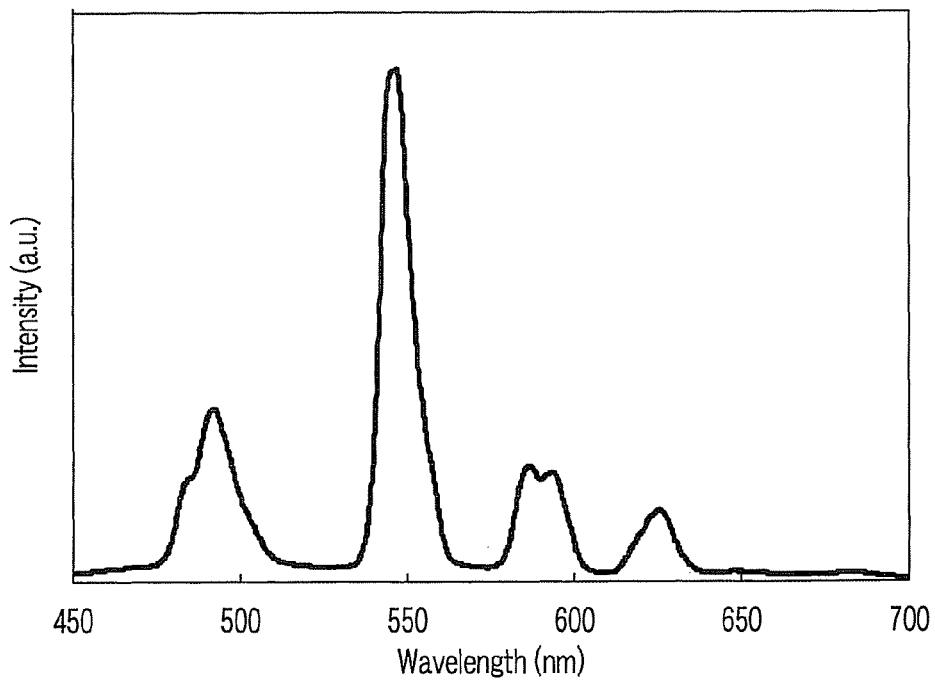
FIG. 4 shows an emission spectrum of the luminescent material according to further embodiment.
Figure 5:
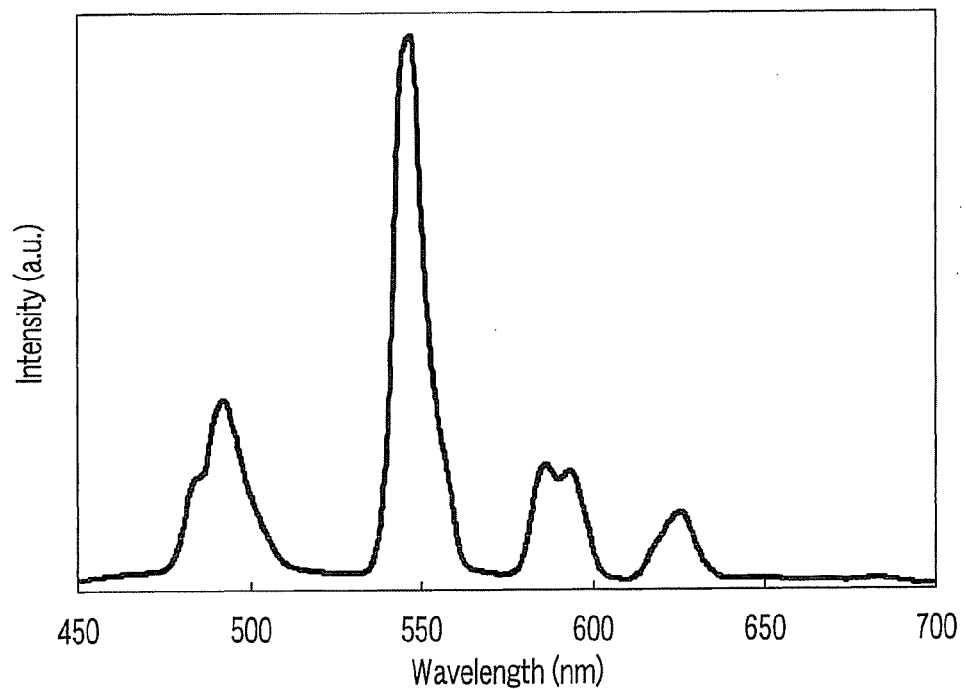
FIG. 5 shows an emission spectrum of the luminescent material according to further embodiment.
Figure 6:
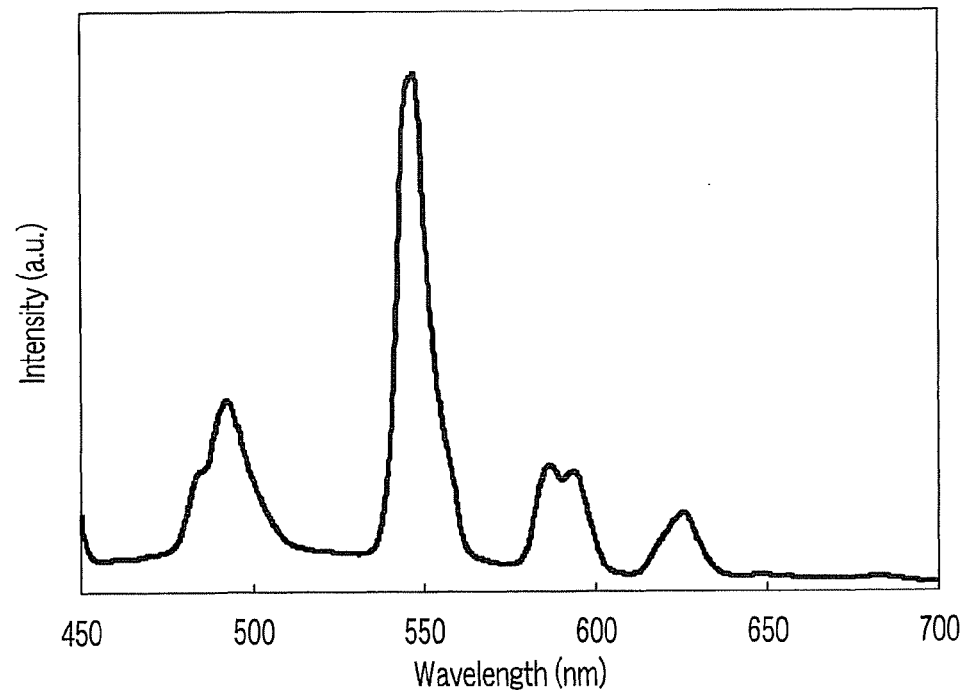
FIG. 6 shows an emission spectrum of the luminescent material according to further embodiment.

Next, by excitation light having a different wavelength, the $(Y_{0.833}, La_{0.092}, Tb_{0.05}, Ce_{0.025})_2Si_3O_3N_4$ luminescent material was excited and the resultant emission spectrum was measured. The wavelength of the excitation light employed was three kinds, i.e., 360, 400 and 440 nm. The emission spectrums obtained through the employment of these kinds of excitation light are shown in FIGS. 4, 5 and 6. It will be recognized that in any case where any one of these wavelengths was employed for the excitation, the luminescent materials activated with Tb, Ce and La were capable of exhibiting an emission peak originating from $Tb^{3+}$, which is located in the vicinity of 493, 547, 587 and 626 nm.

Figure 7:
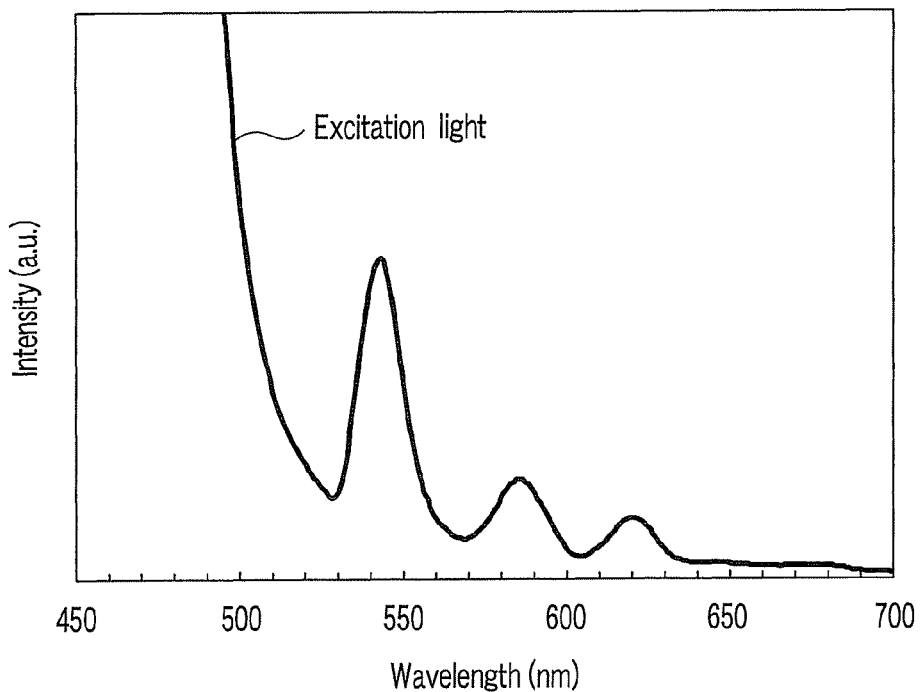
FIG. 7 shows an emission spectrum of the luminescent material according to further embodiment.

Further, by a blue LED exhibiting a peak wavelength at 457 nm, a $(Y_{0.697}, La_{0.078}, Tb_{0.20}, Ce_{0.025})_2Si_3O_3N_4$ luminescent material was excited to measure the emission spectrum thereof. The results are shown in FIG. 7. Even with this blue LED, it was possible to confirm an emission peak originating from $Tb^{3+}$ and having a peak wavelength of 545 nm.

As described above, it is possible, in the case of the luminescent material according to this embodiment, to obtain a narrowband emission originating from $Tb^{3+}$ as it is excited by light having a peak wavelength ranging from 360 to 460 nm. More specifically, a narrowband emission originating from the $^5D_4 \to {}^7F_J$ (J=6, 5, 4, 3) transition of $Tb^{3+}$ can be obtained from at least one of four wavelength regions, i.e., 480-495, 540-550, 570-590 and 610-630 nm.

The reason for this can be considered as follows. Generally, in the case of the luminescent material which is activated by $Tb^{3+}$, the emission thereof is absorbed by the 4f-5d transition of $Tb^{3+}$ and then the light is emitted through the 4f-4f transition. In the case where ultraviolet light of wavelength 254 nm or thereabouts is employed, the luminescent material is enabled to effectively absorb through the 4f-5d transition and emit light through the 4f-4f transition. However, in the case where an excitation light exhibiting a peak intensity at a long wavelength of 300 nm or more is employed, since the $Tb^{3+}$ has no absorption band, the excitation light can be scarcely absorbed by the luminescent material, thus making it impossible to generate the emission of light.

In the case of the luminescent material according to this embodiment, it is co-activated with Ce in addition to Tb. In the case of the $(Y_{1-x1-y1}, Tb_{x1}, Ce_{y1})_a Si_b O_c N_d$ luminescent material wherein Ce is incorporated as a co-activator, when it is excited with light having a peak wavelength of 360-460 nm, this excitation light is absorbed through the 4f-5d transition of $Ce^{3+}$ and the energy thus absorbed is transferred from the 5d band of $Ce^{3+}$ to the $^5D_4$ of $Tb^{3+}$, thereby enabling to obtain a peak emission at this $Tb^{3+}$. The reason for this may be assumably attributed to the fact that since Ce acts as a sensitizer, it is now made possible to absorb the light in the near-ultraviolet region.

However, it cannot be said that as long as any of luminescent materials are co-activated by Tb and Ce, it is possible to obtain a narrowband emission of Tb as they are irradiated with near-ultraviolet excitation light. Namely, unless the position of the 5d band of $Ce^{3+}$ is approximately identical with the energy position of the $^5D_4$ of $Tb^{3+}$, the energy transfer as described above would not be brought about. The $(Y_{1-x1-y1}, Tb_{x1}, Ce_{y1})_a Si_b O_c N_d$ luminescent material according to this embodiment is rare in the respect that the position of the 5d band of $Ce^{3+}$ is very close to the energy position of the $^5D_4$ of $Tb^{3+}$.

The luminescent material having a composition represented by the formula A1 and the luminescent material having a composition represented by the formula A2 were measured with respect to the excitation spectrum thereof. As a result, it was confirmed that, in any of these luminescent materials, the absorption of light is enabled to exist up to the vicinity of 460 nm. The excitation spectrum can be obtained by measuring luminescent material powder by diffusion scattering method using, for example, an F-3000 fluorospectrophotometer (trade name, Hitachi Ltd.).

Figure 8:
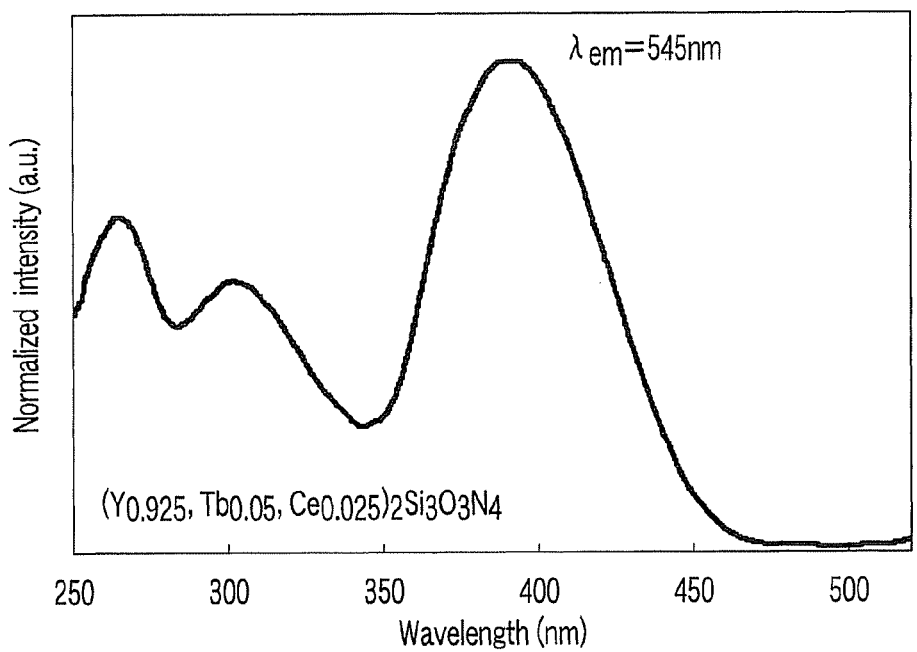
FIG. 8 shows an excitation spectrum of the luminescent material according to further embodiment.
Figure 9:
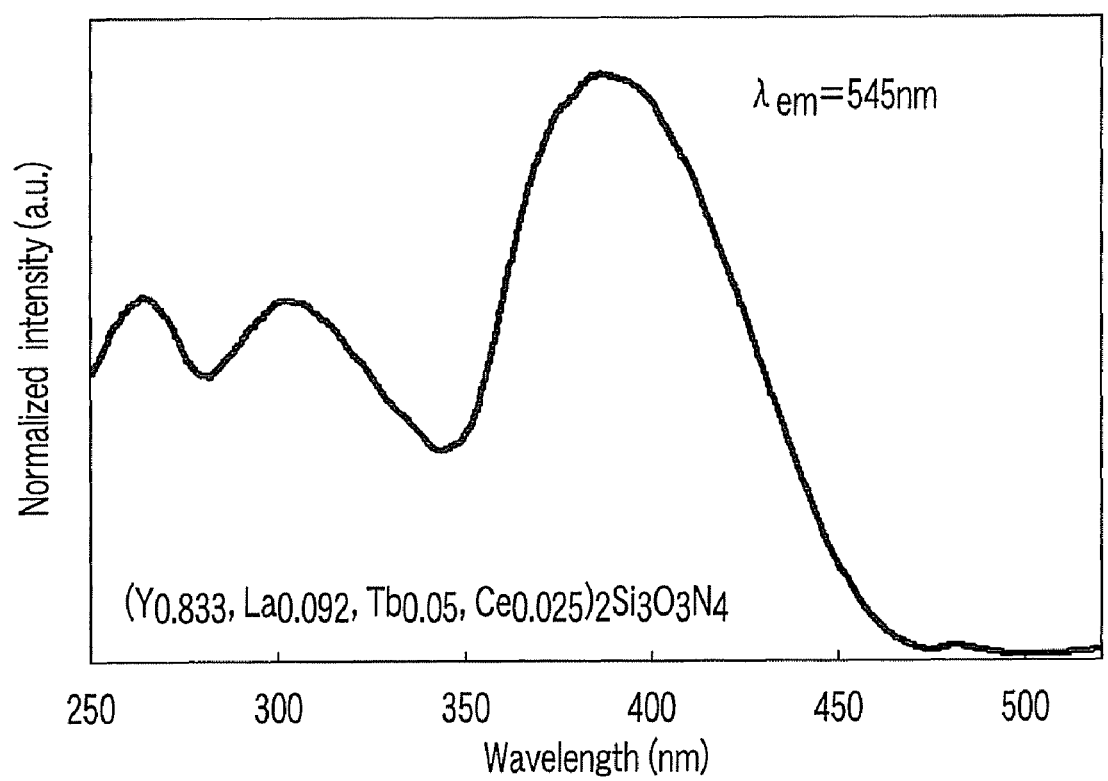
FIG. 9 shows an excitation spectrum of the luminescent material according to further embodiment.

FIG. 8 shows an excitation spectrum which was obtained through the observation of the 545 nm emission of the $(Y_{0.925}, Tb_{0.05}, Ce_{0.025})_2Si_3O_3N_4$ luminescent material. FIG. 9 shows an excitation spectrum which was obtained through the observation of the 545 nm emission of the $(Y_{0.833}, La_{0.092}, Tb_{0.05}, Ce_{0.025})_2Si_3O_3N_4$ luminescent material. It will be recognized from FIGS. 8 and 9 that the $(Y_{0.925}, Tb_{0.05}, Ce_{0.025})_2Si_3O_3N_4$ luminescent material and the $(Y_{0.833}, La_{0.092}, Tb_{0.05}, Ce_{0.025})_2Si_3O_3N_4$ luminescent material were both capable of being excited in the wavelength range of 360-460 nm.

Since the peak of the excitation spectrum is located in the vicinity of 390 nm, these luminescent materials can be most effectively excited by excitation light ranging in wavelength from 370 to 410 nm, i.e., from the ultraviolet region to near-ultraviolet region. In contrast, when these luminescent materials are excited with light having an excitation wavelength exceeding 460 nm, the intensity of the narrowband emission originating from $Tb^{3+}$ would decrease, thus making it impracticable.

In order to identify the crystal phase of the $(Y_{0.925}, Tb_{0.05}, Ce_{0.025})_2Si_3O_3N_4$ luminescent material and of the $(Y_{0.833}, La_{0.092}, Tb_{0.05}, Ce_{0.025})_2Si_3O_3N_4$ luminescent material, these luminescent materials were measured with respect to the diffraction pattern thereof by powder X-ray diffractometry (XRD). Then, the diffraction patterns obtained were compared with the Joint Committee on Powder Diffraction Standards (JCPDS) cards, thereby performing the identification of crystal phase.

In this XRD measurement, a sample of the synthesized luminescent material is measured with respect to the diffraction pattern by, for example, M18XHF$^{22}$-SRA (trade name, MAC/Science Company Co., Ltd. (Bruker AXS K. K.)) and then, the resultant diffraction pattern is compared with that of the JCPDS card.

Figure 10:
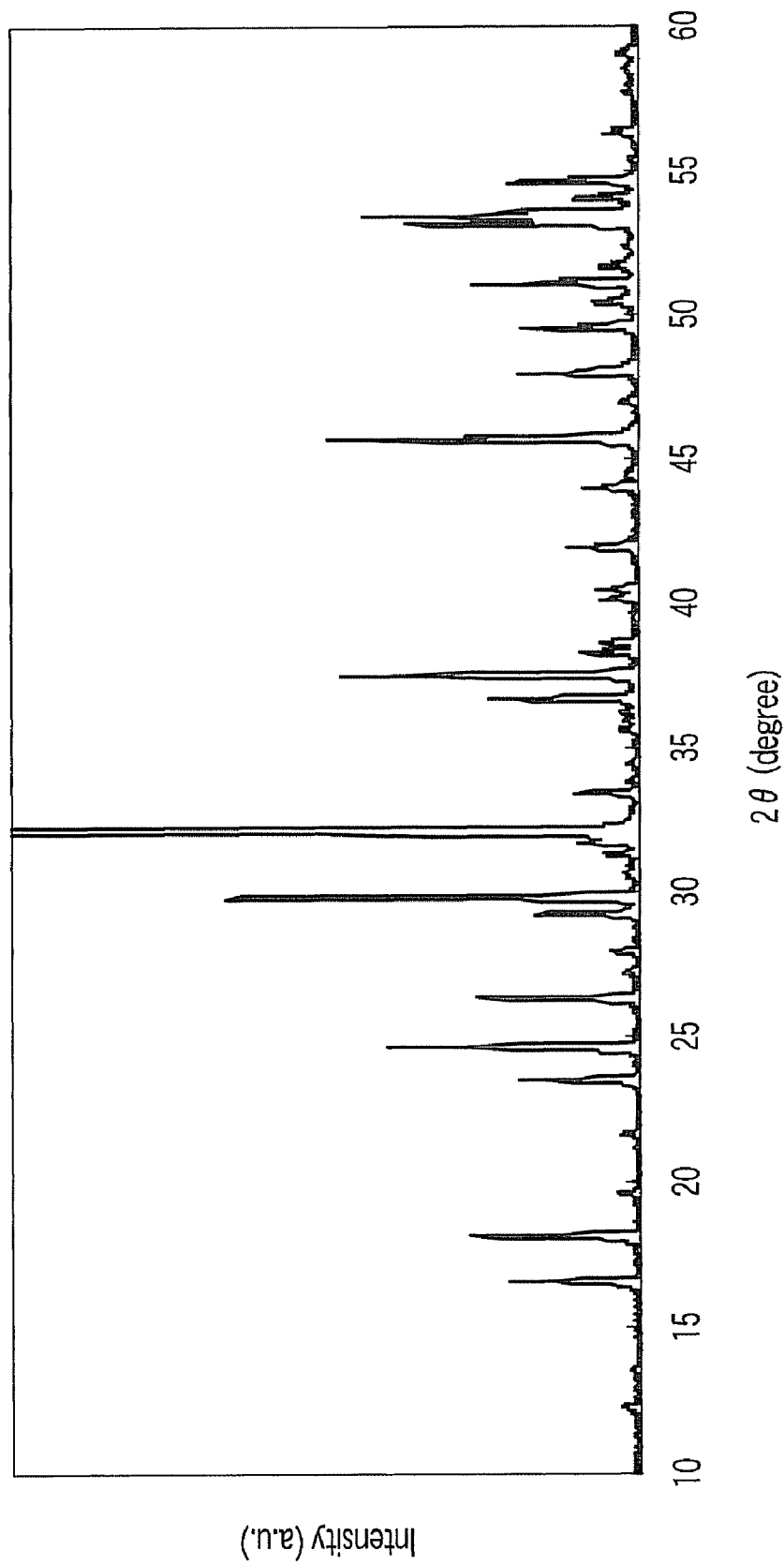
FIG. 10 shows an X-ray diffraction pattern of the luminescent material according to further embodiment.
Figure 11:
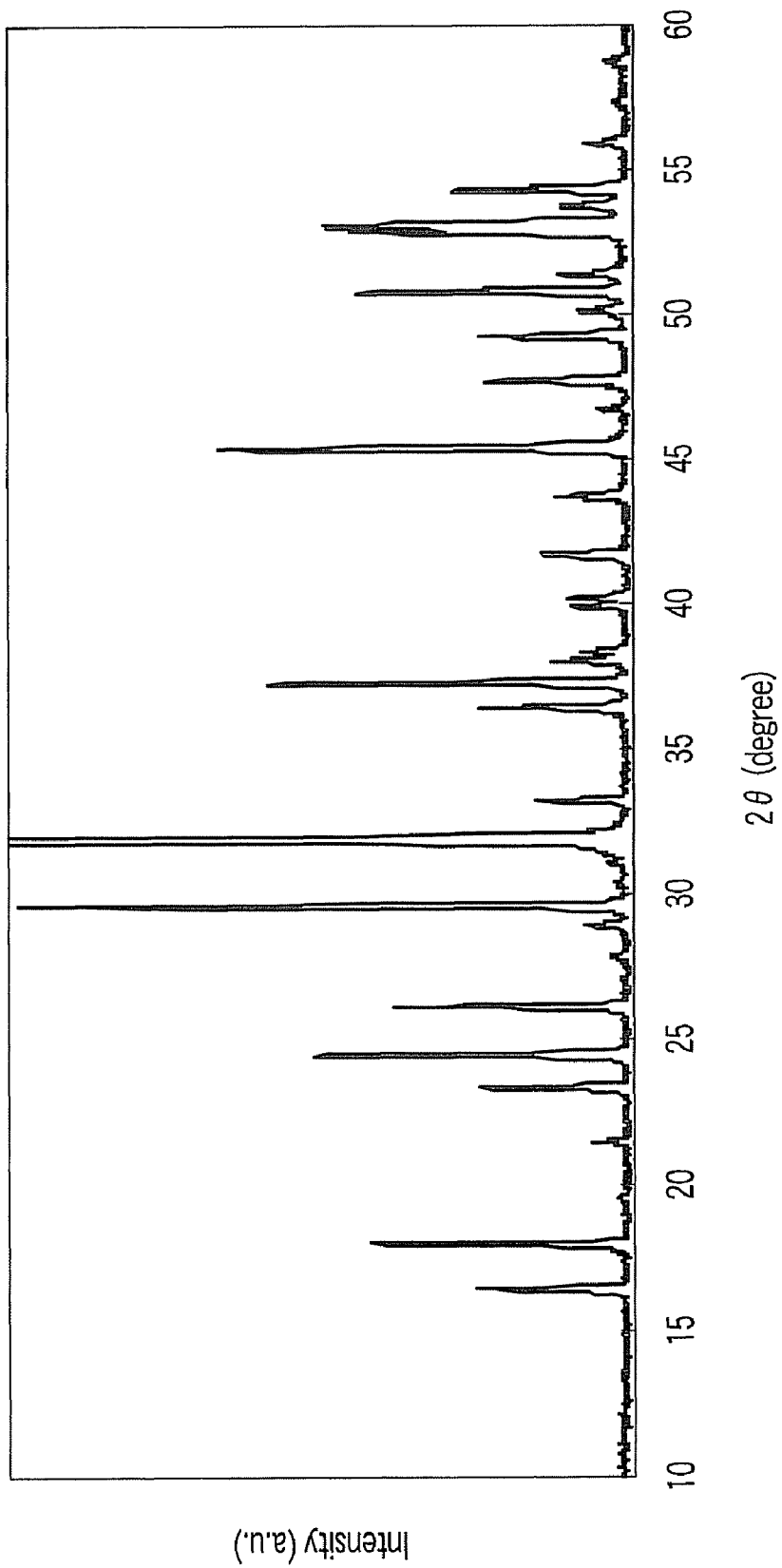
FIG. 11 shows an X-ray diffraction pattern of the luminescent material according to further embodiment.

In order to obtain an X-ray diffraction pattern, the $(Y_{0.925}, Tb_{0.05}, Ce_{0.025})_2Si_3O_3N_4$ luminescent material and the $(Y_{0.833}, La_{0.092}, Tb_{0.05}, Ce_{0.025})_2Si_3O_3N_4$ luminescent material were subjected to the XRD measurement. FIGS. 10 and 11 show the resultant X-ray diffraction patterns, respectively. The diffraction patterns thus obtained were found approximately identical with the diffraction pattern of tetragonal system $Y_2Si_3O_3N_4$ phase shown in JCPDS card #45-249.

It will be recognized from these results that in the case of the $(Y_{1-x1-y1}, Tb_{x1}, Ce_{y1})_a Si_b O_c N_d$ luminescent material which is activated by terbium and cerium, the components Y, Tb and Ce are all included therein in a state of solid-solution. Further, in the case of the $(Y_{1-w2-x2-y2}, M_{w2}, Tb_{x2}, Ce_{y2})_a Si_b O_c N_d$ luminescent material which is added with M and activated by terbium and cerium, the components Y, M, Tb and Ce are all included therein in a state of solid-solution. When the content w2 of M is confined to the range of: $0.01 \leq w2 \leq 0.3$, it was impossible to confirm the presence, in any substantial amount, of crystal phases other than the $Y_2Si_3O_3N_4$ phase. It will be recognized from this fact that all of Y, M, Tb and Ce are existed therein in a state of solid-solution.

If the diffraction pattern of the luminescent material having a composition represented by the formula A2 has a peak which is identical with the peak of the $Y_2Si_3O_3N_4$ phase, it can be said that the $Y_2Si_3O_3N_4$ phase is generated therein.

Since the luminescent material thus synthesized has a structure wherein an activating element such as Tb, Ce, etc., as well as an additive element such as M, etc., is substituted for the Y-site, the diffraction peak to be obtained from the XRD measurement will be affected by the change of lattice constant that may be caused due to the substituting elements. For this reason, the diffraction pattern to be obtained may not be accurately identical with the diffraction pattern of $Y_2Si_3O_3N_4$ phase described in JCPDS card #45-249. However, even if the diffraction pattern to be obtained is such that 2θ thereof is shifted in peak by several degrees, the diffraction pattern can be regarded as being identical with the diffraction pattern of $Y_2Si_3O_3N_4$ phase.

Further, observation by a fluorescence microscope was performed on the $(Y_{0.875}, Tb_{0.10}, Ce_{0.025})_2Si_3O_3N_4$ luminescent material and the $(Y_{0.698}, La_{0.077}, Tb_{0.20}, Ce_{0.025})_2Si_3O_3N_4$ luminescent material. This microscopic observation was performed in such a manner that a synthesized sample of luminescent material was excited by irradiating it with excitation light having a wavelength of 365 nm to generate the emission from the luminescent material, which emission was observed by ECLIPSE80i (trade name, Nikon Corporation) for example. It was confirmed from the results of the observation using the fluorescence microscope that the synthesized $(Y_{0.875}, Tb_{0.10}, Ce_{0.025})_2Si_3O_3N_4$ luminescent material and the $(Y_{0.698}, La_{0.077}, Tb_{0.20}, Ce_{0.025})_2Si_3O_3N_4$ luminescent material were formed of particles having a particle diameter ranging from 5 to 30 μm and uniformly emitting green light due to the irradiation thereof with an excitation light having a wavelength of 365-435 nm.

Figure 12:
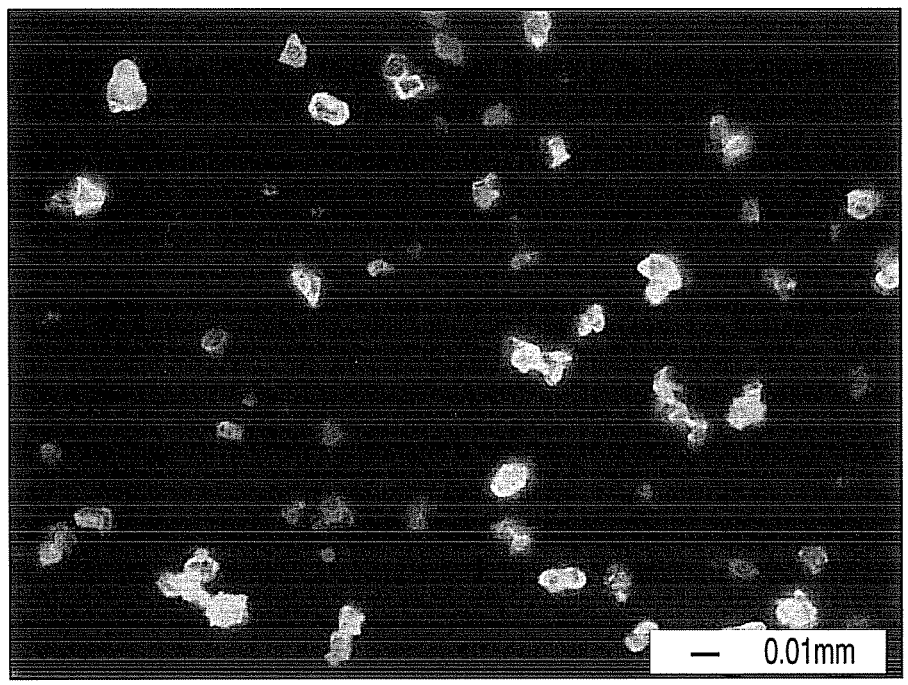
FIG. 12 shows a microphotograph obtained from the excitation of the luminescent material by light having a wavelength of 365 nm according to further embodiment.
Figure 13:
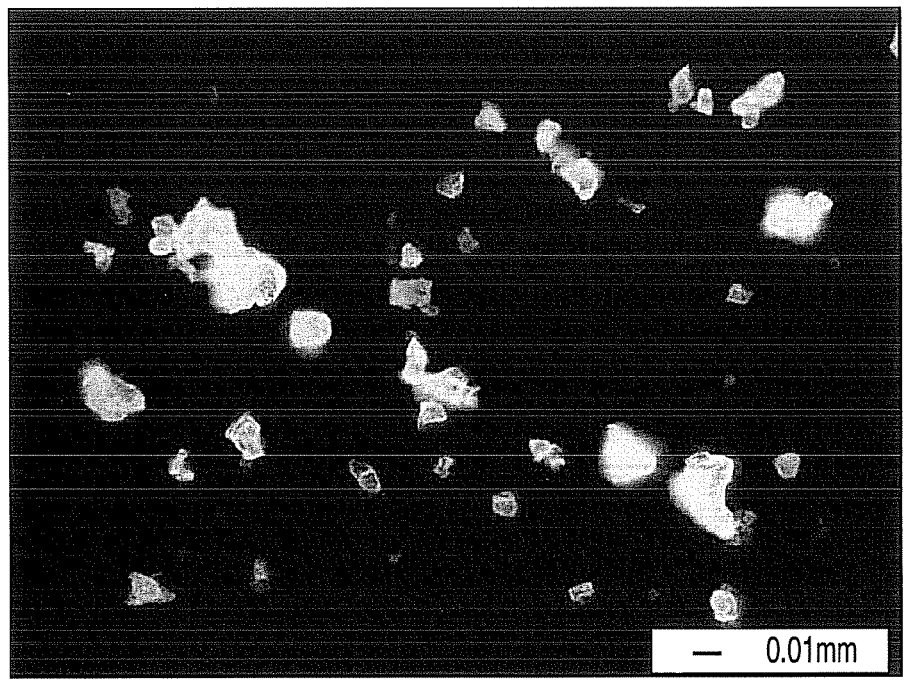
FIG. 13 shows a microphotograph obtained from the excitation of the luminescent material by light having a wavelength of 365 nm according to further embodiment.

FIGS. 12 and 13 show the results of the microscopic observation of the $(Y_{0.875}, Tb_{0.10}, Ce_{0.025})_2Si_3O_3N_4$ luminescent material and the $(Y_{0.698}, La_{0.077}, Tb_{0.20}, Ce_{0.025})_2Si_3O_3N_4$ luminescent material as they were irradiated with an excitation light having a wavelength of 365 nm.

The luminescent material according to this embodiment can be manufactured, basically, by a process wherein various kinds of raw material powder are mixed together and then subjected to sintering as described above. The luminescent material thus sintered should preferably be subjected to any appropriate post-treatment such as washing when applying the luminescent material to a light-emitting device, etc. As the manner of washing, it is possible to employ acid-washing wherein dilute hydrochloric acid is employed. In this acid-washing, unreacted raw nitride material, etc., can be substantially removed, thus making it possible to obtain only desired luminescent materials. Some kinds of substances among a portion of oxynitride or nitride such as AlN are unstable in air atmosphere or in water. However, the luminescent materials according to this embodiment are stable even in air atmosphere or in an aqueous solution of acid. Therefore, the degree of freedom with regard to the post-treatment to be performed on a sample after the sintering thereof is very high.

If required for the purpose of preventing moisture, a surface covering material may be coated on the surface of luminescent particles manufactured, wherein the surface covering material may be formed of at least one selected from the group consisting of silicone resin, epoxy resin, fluororesin, tetraethoxy silane (TEOS), silica, zinc silicate, aluminum silicate, calcium polyphosphate, silicone oil and silicone grease. Zinc silicate and aluminum silicate may be represented, for example, by $ZnO.cSiO_2$ ($1 \leq c \leq 4$) and $Al_2O_3.dSiO_2$ ($1 \leq d \leq 10$), respectively.

The surface of the luminescent particles may not be completely covered with the surface covering material, so that part of the surface of the luminescent particles may be exposed. As long as the surface covering material made of the aforementioned materials is existed on the surface of the luminescent particles, it is possible to derive the effects thereof. This surface covering material can be applied to the surface of the luminescent particles by a fluid dispersion containing the surface covering material or use of a solution of the surface covering material. Specifically, the luminescent particles are immersed in the fluid dispersion or the solution for a predetermined period of time and then dried by heating, etc., thus depositing the surface covering material on the surface of luminescent particles. In order to secure the effects of the surface covering material without degrading the inherent functions of the luminescent particles, the quantity of the surface covering material should preferably be confined to about 0.1-5% by volume based on the luminescent particles.

Further, the luminescent material according to this embodiment is graded depending on the coating method thereof to a light-emitting device to be employed. For example, in the case of the ordinary white LED where excitation light having a wavelength of 360-460 nm is employed, the luminescent material is employed after the luminescent material has been graded into 5 to 50 μm or thereabouts. If the particle diameter of the luminescent material is too small, such as 1 μm or less, the amount of non-emission surface layer may be undesirably increased, thus reducing the intensity of emission. On the other hand, if the particle diameter of luminescent material is too large, a coating device may be clogged with the luminescent material when coating the luminescent material on an LED, thus not only reducing the yield but also giving rise to the discoloration of the light-emitting device to be obtained. In order to overcome these problems, the luminescent materials according to this embodiment should preferably be employed after the grading thereof into the range of 5 to 50 μm or thereabouts.

As described above, it is possible, through the excitation of a yttrium silicon oxynitride luminescent material which is activated with terbium and cerium by an excitation light having a peak wavelength falling within the region of 360-460 nm, to obtain a narrowband emission originating from $Tb^{3+}$. Further, it is possible, through the combination of the luminescent material of this embodiment with an emission element exhibiting an emission peak falling within the wavelength region of 360-460 nm, to obtain a light-emitting device which is high in efficiency and color rendering. As the emission element, either an LED chip or a laser diode may be employed.

In the case of the light-emitting device according to this embodiment, it is possible to obtain a general color rendering index Ra of 77 or more. The reason for this can be mainly attributed to a narrowband emission of nearly 490 nm originating from the $^5D_4 \rightarrow ^7F_J$ (J=6, 5, 4, 3) transition of terbium employed as an activator. The emission of light having a wavelength in the vicinity of 490 nm is effective in filling the emission interface between the blue-region emission that has been conventionally employed for creating white light and the green- or yellow-region emission. For this reason, it is possible to increase Ra. Further, since the energy of excitation light can be converted into the narrowband emission of $Tb^{3+}$ which corresponds to the peak of the visual spectral efficiency curve, an emission of high efficiency (high luminous flux) can be obtained.

The luminescent material according to this embodiment is one which emits colors ranging from green to yellow. Therefore, it is possible to obtain a white light-emitting device as this luminescent material is employed in combination with a blue luminescent material and a red luminescent material. For example, where a light source of the near-ultraviolet region is employed, the luminescent material according to this embodiment can be employed in combination with a blue luminescent material and a red luminescent material, thereby making it possible to provide a white light-emitting device.

The blue luminescent material can be defined as being a luminescent material having a major emission peak in a wavelength region ranging from bluish purple to blue and having a wavelength of 430 to 510 nm. As examples of the blue luminescent material, it is possible to employ, for example, halophosphate luminescent materials such as $(Sr, Ca, Ba, Mg)_5(PO_4)_3(Cl, Br)$:Eu, $(Sr, Ca, Ba, Mg)_5(PO_4)_3Cl$:Eu, etc.; phosphate luminescent materials such as $2SrO.0.84P_2O_5.0.16B_2O_3$, etc.; and alkaline earth metal aluminate luminescent materials such as $BaMgAl_{10}O_{17}$:Eu, $BaMg_2Al_{16}O_{27}$:Eu, $BaMgAl_{10}O_{17}$:Eu,Mn, etc. It should be noted that, by the term "major emission peak", it is intended to mean a wavelength at which the peak intensity of the emission spectrum as reported so far in the prior documents or patent publications becomes the largest. The fluctuation of emission peak of around 10 nm due to the addition of a small amount of element or due to slight changes in composition when manufacturing the luminescent material may be regarded as being the major emission peak that has been reported so far.

The red luminescent material can be defined as being a luminescent material having a major emission peak in a wavelength region ranging from orange to red and having a wavelength of 580 to 680 nm. As examples of the red luminescent material, it is possible to employ, for example, silicate luminescent materials such as $(Sr, Ca, Ba)_2SiO_4$:Eu, etc.; oxyfluoride luminescent materials such as $3.5MgO.0.5MgF.GeO_2$:$Mn^{4+}$, etc.; oxide luminescent materials such as $YVO_4$:Eu, etc.; oxysulfide luminescent materials such as $(La, Gd, Y)_2O_2S$:Eu, etc.; sulfide luminescent materials such as $(Ca, Sr, Ba)S$:Eu, etc.; and nitride luminescent materials such as $(Sr, Ba, Ca)_2Si_5N_8$:Eu, $(Sr, Ca)AlSiN_3$:Eu, etc.

Other than the aforementioned luminescent materials, it is also possible to employ a bluish green luminescent material and a yellow luminescent material, depending on the applications thereof.

It should be noted that it is also possible to employ a blue LED as a light source. In that case, a blue type luminescent material may be omitted as required.

Figure 14:
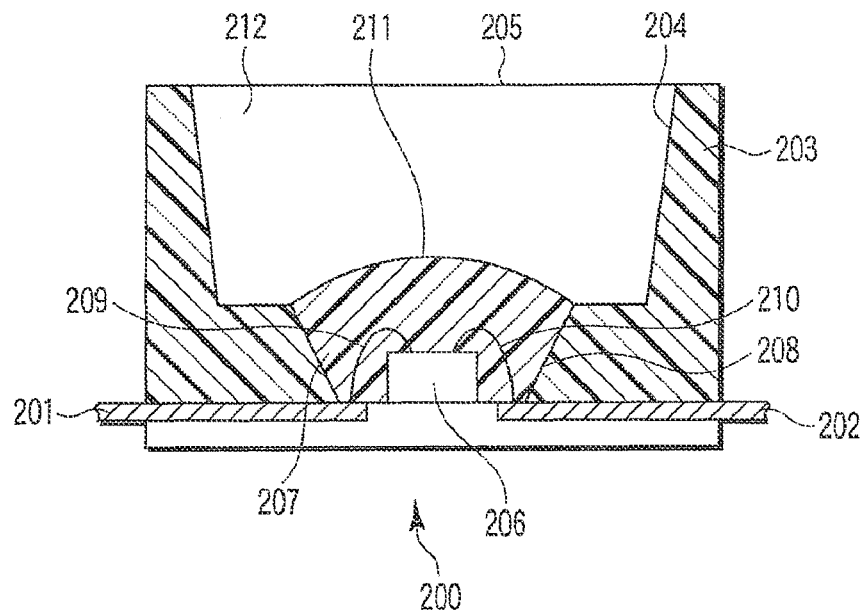
FIG. 14 is a cross-sectional view illustrating a light-emitting diode device according to one embodiment.

The light-emitting device shown in FIG. 14 is constituted by a resin stem 200. This resin stem 200 comprises a couple of leads 201 and 202 constituting a lead frame and a resin portion 203 which is formed integral with the lead frame. This resin portion 203 is provided with a recess 205 having an upper opening which is wider than the bottom thereof. This recess is provided, on the sidewall thereof, with a reflective surface 204.

A light-emitting chip 206 is mounted on a central portion of the approximately circular bottom of the recess 205 by a Ag paste, etc. As the light-emitting chip 206, it is possible to employ those which are capable of emitting ultraviolet or visible light. For example, it is possible to employ a GaAs-based or a GaN-based semiconductor light-emitting diode, etc. The electrodes (not shown) of the light-emitting chip 206 are connected, through bonding wires 207 and 208 made of Au and the like, with the lead 201 and the lead 202, respectively. It should be noted that the arrangement of these leads 201 and 202 can be optionally modified.

A luminescent layer 209 is disposed in the recess 205 of the resin portion 203. This luminescent layer 209 can be formed by dispersing the luminescent material 210 of the embodiment in a resin layer 211 made of, for example, silicone resin at a content ranging from 5 to 50 wt %. The luminescent material can be adhered by various kinds of binders such as an organic material such as resins and an inorganic material such as glass.

As the binder formed of an organic material, it is suitable to use a transparent resin which has excellent in light resistance, such as epoxy resin or an acrylic resin other than the aforementioned silicone resin. As the binder formed of an inorganic material, it is suitable to use low-melting-point glass wherein alkaline earth borate, etc., is employed, ultra-fine powder of silica or alumina, etc., for enabling the luminescent material of relatively large grain size to be adhered, or alkaline earth phosphate that can be obtained by sedimentation. These binders may be employed singly or in combination of two of more kinds.

The luminescent material to be employed in the luminescent layer may be applied with surface coating as required. This surface coating is effective in preventing the luminescent material from being degraded by external factors such as heat, moisture and ultraviolet light. Further, this surface coating is also effective in adjusting the dispersibility of luminescent material, thus facilitating the design of the luminescent layer.

As the light-emitting chip 206, it is also possible to employ a flip-chip structure wherein an n-type electrode and a p-type electrode are both disposed on the same surface thereof. In this case, it is possible to overcome the problems accompanied with wiring such as the cut-off or peeling of wire and the absorption of light by the wire, thereby making it possible to obtain a semiconductor light-emitting device which is excellent in reliability and luminance. Further, an n-type substrate may be employed for forming the light-emitting chip 206, thus fabricating the following structure. More specifically, an n-type electrode is formed on the bottom surface of the n-type substrate and a p-type electrode is formed on the top surface of the semiconductor layer on the substrate with either the n-type electrode or the p-type electrode being mounted on the lead. In this case, the n-type electrode or the p-type electrode may be connected with the other lead by wire. The size of the light-emitting chip 206 as well as the size and configuration of the recess 205 may be optionally modified.

Figure 15:
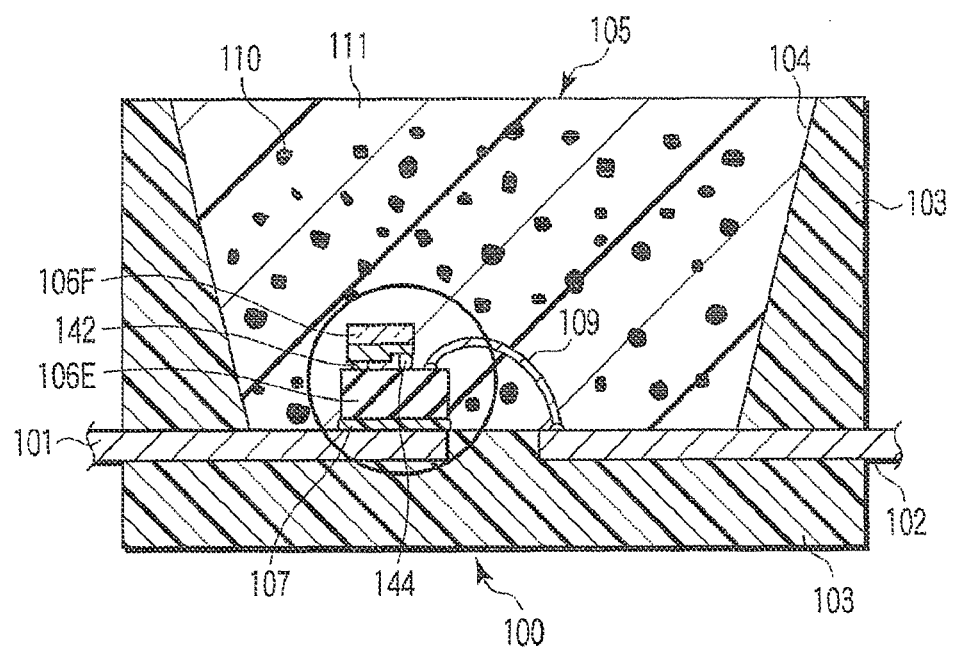
FIG. 15 is a cross-sectional view illustrating a light-emitting diode device according to another embodiment.

The light-emitting device shown in FIG. 15 comprises a resin stem 100, a semiconductor light-emitting element 106F mounted on the resin stem 100, and a sealing body 111 covering the semiconductor light-emitting element 106F. The resin stem 100 comprises a couple of leads 101 and 102 constituting a lead frame and a resin portion 103 which is formed integral with these. These leads 101 and 102 are disposed in such a manner that one end of each of these leads faces close to each other. The other end of each of these leads is extended in a direction opposite to each other and protruded out of the resin portion 103.

The resin portion 103 is provided with an opening 105, on the bottom of which a protective Zener diode 106E is mounted by an adhesive 107. On this protective Zener diode 106E is mounted a semiconductor light-emitting element 106F. Namely, a diode 106E is mounted on the lead 101. A wire 109 is connected at one end thereof with the diode 106E and at the other end with the lead 102.

The semiconductor light-emitting element 106F is surrounded by the inner walls of the resin portion 103. The inner walls are inclined in the light-extracting direction, thereby enabling them to act as a reflective surface 104 for reflecting light. The sealing body 111 filled in the opening 105 contains a luminescent material 110. The semiconductor light-emitting element 106F is disposed on the protective Zener diode 106E. As the luminescent material 110, a luminescent material according to the embodiment is employed.

Figure 16:
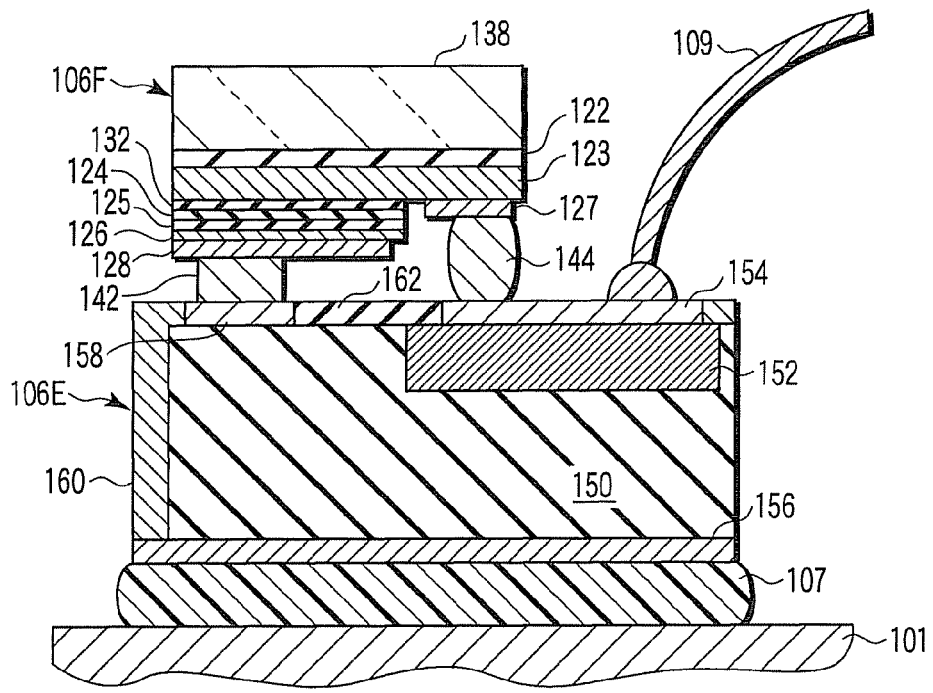
FIG. 16 is an enlarged cross-sectional view of a light-emitting element.

Next, the peripheral portion of the chip of light-emitting device will be explained in detail. As shown in FIG. 16, the protective Zener diode 106E is of planar structure wherein a p-type region 152 is formed on the surface of an n-type silicon substrate 150. A p-side electrode 154 formed in a p-type region 152 and an n-side electrode 156 is formed on the bottom surface of the substrate 150. In opposite to this n-side electrode 156, an n-side electrode 158 is formed also on the top surface of the Zener diode 106E. These two n-side electrodes 156 and 158 are connected with each other through a wiring layer 160 which is provided on the sidewall of the Zener diode 106E. Further, a high reflection film 162 is formed on the top surface of the Zener diode 106E on which the p-side electrode 154 and the n-side electrode 158 are provided. This high reflection film 162 is a film which exhibits a high reflectance to the light to be emitted from the light-emitting element 106F.

In the semiconductor light-emitting element 106F, a buffer layer 122, an n-type contact layer 123, an n-type cladding layer 132, an active layer 124, a p-type cladding layer 125 and a p-type contact layer 126 are successively laminated on a translucent substrate 138. Further, an n-side electrode 127 is deposited on the n-type contact layer 123, and a p-side electrode 128 is deposited on the p-type contact layer 126. The light emitted from the active layer 124 is taken up through the translucent substrate 138.

The light-emitting element 106F constructed in this manner is flip-chip-mounted via a bump on the diode 106E. Specifically, the p-side electrode 128 of the light-emitting element 106F is electrically connected through a bump 142 with the n-side electrode 158 of the diode 106E. Further, the n-side electrode 127 of the light-emitting element 106F is electrically connected through a bump 144 with the p-side electrode 154 of the diode 106E. A wire 109 is bonded, through one end thereof, to the p-side electrode 154 of the diode 106E and the other end of the wire 109 is connected with the lead 102.

Figure 17:
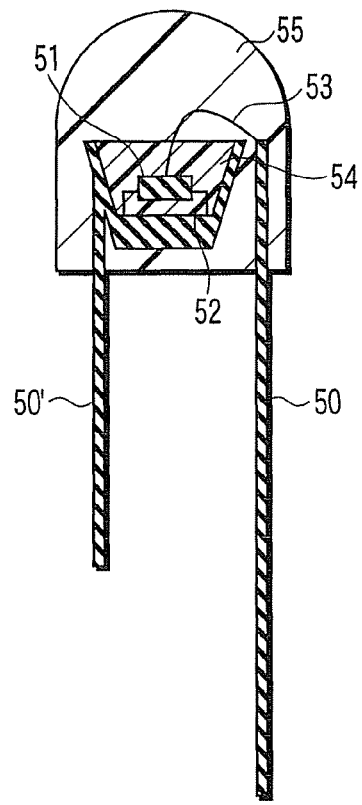
FIG. 17 is a cross-sectional view illustrating a light-emitting diode device according to further embodiment.

In the shell-type light-emitting device shown in FIG. 17, a semiconductor light-emitting element 51 is mounted through a mounting material 52 on a lead 50' and covered with a pre-dipping material 54. By a wire 53, a lead 50 is connected with the semiconductor light-emitting element 51 and the resultant composite body is sealed with a casting material 55. The luminescent material according to the embodiment is contained in the pre-dipping material 54.

As described above, a light-emitting device, for example a white LED, according to the embodiment emits light having a narrowband emission spectrum. Because of this, the light-emitting device according to the embodiment is suitable not only as an ordinary illumination application such as a fluorescent lamp but also light-emitting device such as a backlight. In the case of the conventional white LED, since it is combined with a luminescent material of wideband emission and enabled to emit light having a wideband spectrum throughout the entire visible light region, it is accompanied with a problem that when the white LED is employed in combination with a color filter, most of the light volume of white LED employed as a light source is absorbed by the filter.

Whereas, in the case of the white LED according to the embodiment, since it emits the light having a narrowband spectrum, it is possible to efficiently utilize a specific wavelength as it is employed in combination with a filter. Especially, when an oxyfluoride luminescent material such as $3.5MgO \cdot 0.5MgF \cdot GeO_2:Mn^{4+}$ or an oxysulfide luminescent material such as $(La, Gd, Y)_2O_2S:Eu$ is employed as a red luminescent material, not only the narrowband green component of the embodiment of the present embodiment but also the red component becomes a narrowband emission, thereby making it possible to efficiently utilize the white light that can be emitted from the light-emitting device. More specifically, the light-emitting device according to the embodiment is most suited for use as a backlight of liquid crystal device or as a green component of an inorganic electroluminescence device where a blue light-emitting layer is employed.

Next, although the present invention will be explained in detail with reference to Examples and Comparative Examples, it should be noted that the following Examples are not intended to limit the present invention and hence can be variously modified so long as the gist of the present invention is not exceeded.

Example 1

A $(Y_{0.875}, Tb_{0.1}, Ce_{0.025})_2Si_3O_3N_4$ luminescent material was prepared. As the raw material powder, 19.2 g of $Y_2O_3$ powder, 12.9 g of $Si_3N_4$ powder, 1.7 g of $Tb_4O_7$ powder, and 0.8 g of $CeO_2$ powder were prepared and uniformly mixed in a ball mill.

The mixed raw material thus obtained was placed in a sintering vessel and sintered in an $N_2$ atmosphere at a temperature ranging from 1500 to 1900° C. for 1-5 hours to obtain a sintered product. This sintered product was pulverized in water and washed with dilute hydrochloric acid. Then, the resultant powder was sieved and dehydrated by suction filtration.

Finally, the resultant powder was dried at a temperature of 100° C. in a drying oven and then finally sieved to obtain a luminescent material of this example. When the luminescent material of Example 1 thus obtained was subjected to quantitative analysis by an ICP emission spectrometric method, the luminescent material of this example was confirmed as having a composition corresponding approximately to the raw materials charged.

Further, the content of each of constituent elements was varied as shown in Table 1, below, thus realizing the luminescent materials of Examples 2-14 and Comparative Examples 1-3. In the case of the luminescent material of Comparative Examples 1 and 2, Ce was not incorporated therein. In the case of the luminescent material of Comparative Example 3, Tb was not incorporated therein.

The peak intensity was determined for each of the luminescent materials, wherein the peak intensity of that of Example 1 was defined as 1 and, based on this peak intensity, the ratio of peak intensity was calculated for other examples, the results being summarized in Table 1, below.

TABLE 1

| | Composition of luminescent material | Peak intensity ratio |
|---|---|---|
| Ex. 2 | $(Y_{0.925}, Tb_{0.05}, Ce_{0.025})_2Si_3O_3N_4$ | 0.48 |
| Ex. 3 | $(Y_{0.833}, La_{0.092}, Tb_{0.05}, Ce_{0.025})_2Si_3O_3N_4$ | 0.71 |
| Ex. 4 | $(Y_{0.697}, Gd_{0.078}, Tb_{0.20}, Ce_{0.025})_2Si_3O_3N_4$ | 1.22 |
| Ex. 5 | $(Y_{0.742}, Lu_{0.083}, Tb_{0.15}, Ce_{0.025})_2Si_3O_3N_4$ | 1.20 |
| Ex. 6 | $(Y_{0.879}, La_{0.046}, Tb_{0.05}, Ce_{0.025})_2Si_3O_3N_4$ | 0.60 |
| Ex. 7 | $(Y_{0.647}, La_{0.278}, Tb_{0.05}, Ce_{0.025})_2Si_3O_3N_4$ | 0.51 |
| Ex. 8 | $(Y_{0.630}, La_{0.070}, Tb_{0.20}, Ce_{0.100})_2Si_3O_3N_4$ | 0.59 |
| Ex. 9 | $(Y_{0.698}, La_{0.077}, Tb_{0.20}, Ce_{0.025})_2Si_3O_3N_4$ | 1.23 |
| Ex. 10 | $(Y_{0.711}, La_{0.079}, Tb_{0.20}, Ce_{0.010})_2Si_3O_3N_4$ | 1.39 |
| Ex. 11 | $(Y_{0.535}, La_{0.060}, Tb_{0.40}, Ce_{0.005})_2Si_3O_3N_4$ | 1.28 |
| Ex. 12 | $(Y_{0.652}, La_{0.073}, Tb_{0.25}, Ce_{0.025})_2Si_3O_3N_4$ | 1.27 |
| Ex. 13 | $(Y_{0.787}, La_{0.044}, Gd_{0.044}, Tb_{0.10}, Ce_{0.025})_2Si_3O_3N_4$ | 1.03 |
| Ex. 14 | $(Y_{0.743}, La_{0.041}, Lu_{0.041}, Tb_{0.15}, Ce_{0.025})_2Si_3O_3N_4$ | 1.22 |
| Comp. Ex. 1 | $(Y_{0.900}, Tb_{0.10})_2Si_3O_3N_4$ | 0.03 |

TABLE 1-continued

| | Composition of luminescent material | Peak intensity ratio |
|---|---|---|
| Comp. Ex. 2 | $(Y_{0.810}, La_{0.09}, Tb_{0.10})_2Si_3O_3N_4$ | 0.04 |
| Comp. Ex. 3 | $(Y_{0.810}, La_{0.09}, Ce_{0.10})_2Si_3O_3N_4$ | 0.12 |

As explained above in reference to FIG. 1, when Ce was not incorporated in the luminescent material of Comparative Example, the emission which was characteristic to Tb as it was excited with light of wavelength 389 nm was very weak and hence impractical. On the other hand, when Tb was not incorporated in the luminescent material, only the wideband emission originating from Ce was confirmed as it was excited with light of wavelength 389 nm.

Whereas, in the case of the luminescent materials of Examples, it was possible to confirm a narrowband emission spectrum originating from $Tb^{3+}$ as the luminescent materials were excited with near-ultraviolet light of wavelength 389 nm or thereabouts. This can be inferred for example from the emission spectrum of the $(Y_{0.925}, Tb_{0.1}, Ce_{0.025})_2Si_3O_3N_4$ luminescent material of Example 1 shown in FIG. 1.

The $(Y_{0.925}, Tb_{0.1}, Ce_{0.025})_2Si_3O_3N_4$ luminescent material of Example 1, a blue luminescent material having a composition of $(Sr, Ca, Ba, Mg)_5(PO_4)_3Cl:Eu$ which was available in the market, and a red luminescent material having a composition of $(La, Y)_2O_2S:Eu$ which was available in the market were mixed with each other to obtain a mixture of luminescent materials. This mixture of luminescent materials was dispersed in silicone resin to prepare a resinous mixture.

The resinous mixture thus obtained was used in combination with an LED chip having a peak wavelength of 393 nm, thus realizing a white LED device. More specifically, the LED chip was mounted through a bump as shown in FIG. 15, thus obtaining the light-emitting device having a structure called flip-chip. This white LED device was identified as Example 15.

Figure 18:
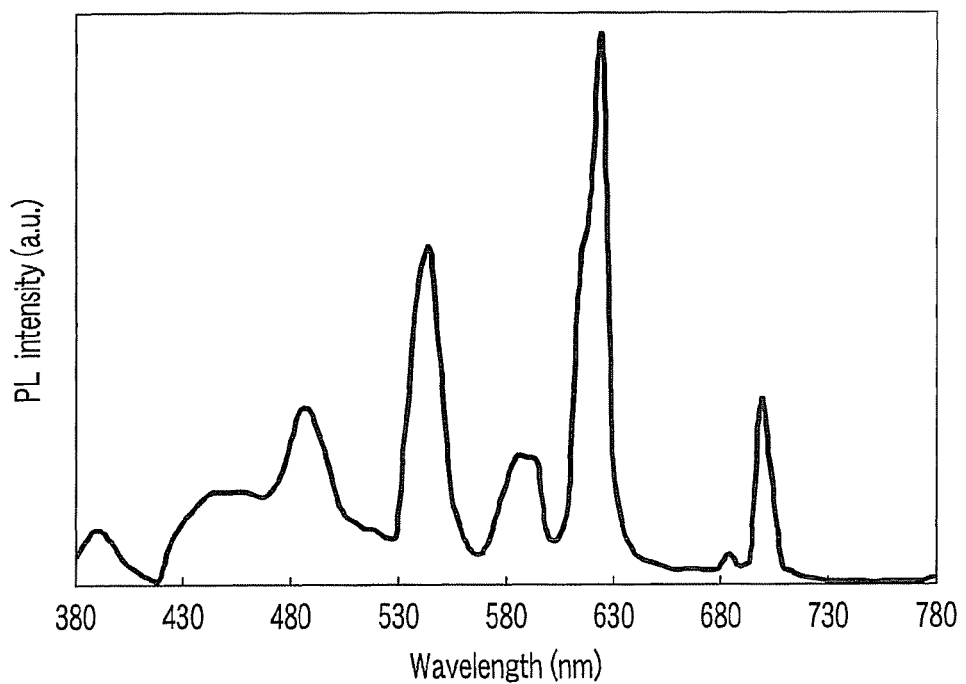
FIG. 18 shows an emission spectrum of the white LED light-emitting device according to one embodiment.

FIG. 18 shows an emission spectrum obtained as the mixing ratio of the luminescent materials of the white LED device of Example 15 was adjusted so as to regulate the color temperature to 4200K. In the case of the white LED device where the color temperature was adjusted to 4200K, the general color rendering index Ra was 84.1. This general color rendering index Ra was determined from the emission spectrum obtained from the white LED device.

Since the general color rendering index Ra was 80 or more, the light-emitting device of this example was found to be very high in color rendering and thus practicable for illumination, etc.

Next, another resinous mixture was prepared in the same manner as described above except that the luminescent material of Example 1 was replaced by the $BaMgAl_{10}O_{17}:Eu,Mn$ green luminescent material. Then, a white LED device was manufactured in the same manner as described above except that the resinous mixture thus prepared was employed. This white LED device was identified as Comparative Example 4. When the luminescent material of Comparative Example 1 was employed in place of the luminescent material of Example 1, the luminescent material of Comparative Example 1 was almost incapable of emitting light as it was excited with an excitation light which was close to near-ultraviolet. For this reason, this LED device was of a kind very low in emission intensity and where the color temperature can be hardly adjusted. More specifically, the light-emitting device where the luminescent material of Comparative Example 1 was employed was such that the general color rendering index Ra thereof was only 42.

The luminescent material of Comparative Example 3 was low in emission intensity. Moreover, because the emission to be obtained was a blue emission of $Ce^{3+}$, even if the $(Sr, Ca, Ba, Mg)_5(PO_4)_3Cl:Eu$ luminescent material is mixed with the red luminescent material having a composition of $(La, Y)_2O_2S:Eu$, it is impossible to adjust it to white light.

Figure 19:
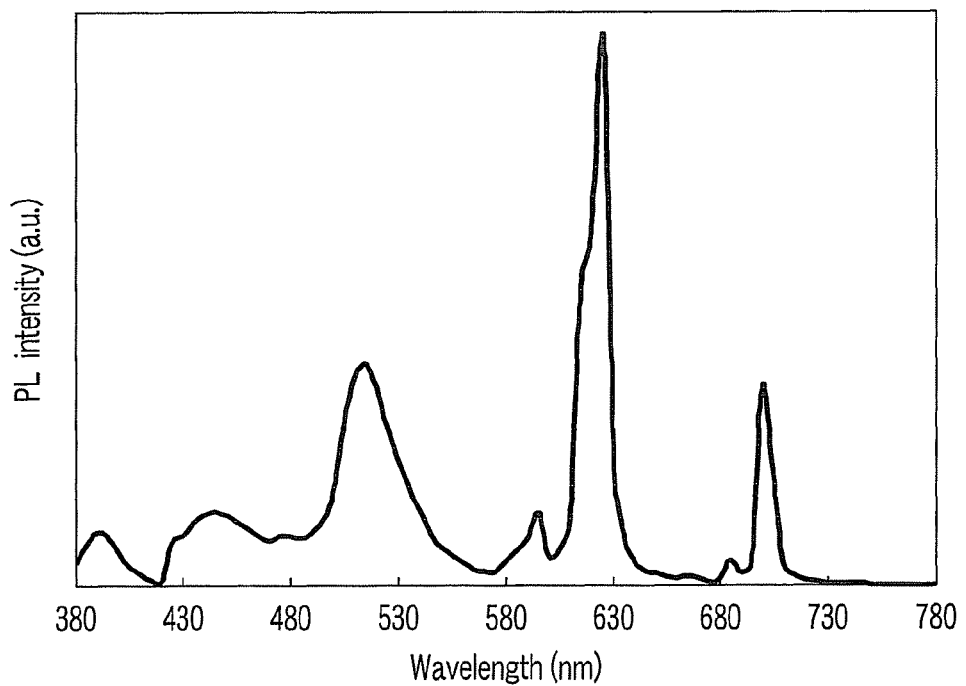
FIG. 19 shows an emission spectrum of the white LED light-emitting device wherein a luminescent material according to the prior art was employed.

FIG. 19 shows an emission spectrum obtained as the white LED device of Comparative Example 4 was adjusted to regulate the color temperature to 4200K. In the case of the white LED device where the color temperature was adjusted to 4200K, the general color rendering index Ra was 42.2.

As is apparent from the comparison between Example 15 and Comparative Example 4, the white LED device where the luminescent material of the Example was employed was more excellent in general color rendering index Ra as than the white LED device of the Comparative Example wherein the color temperature was adjusted to 4200K.

Further, each of the luminescent materials of Examples 2-11 and 14, a blue luminescent material and a red luminescent material were employed and then they were used in combination with a near ultraviolet LED chip as shown in Table 2, below, thus realizing the light-emitting devices of Examples 16-26. More specifically, a luminescent material-containing resin was cast to the LED chip mounted on a frame, thus realizing a light-emitting device having a shell-type structure as shown in FIG. 17.

TABLE 2

| | Peak wavelength of excitation light (nm) | Luminescent materials |
|---|---|---|
| Ex. 16 | 389 | $(Sr, Ca, Ba, Mg)_5(PO_4)_3Cl:Eu$ + Ex. 2 + $La_2O_2S:Eu$ |
| Ex. 17 | 392 | $(Sr, Ca, Ba, Mg)_5(PO_4)_3Cl:Eu$ + Ex. 3 + $(Sr, Ca)_2SiO_4:Eu$ |
| Ex. 18 | 391 | $(Sr, Ca, Ba, Mg)_5(PO_4)_3Cl:Eu$ + Ex. 4 + $(Sr, Ca) AlSiN_3:Eu$ |
| Ex. 19 | 391 | $(Sr, Ca, Ba, Mg)_5(PO_4)_3Cl:Eu$ + Ex. 5 + $(Ba, Sr, Ca)_2Si_5N_8:Eu$ |
| Ex. 20 | 390 | $(Sr, Ca, Ba, Mg)_5(PO_4)_3Cl:Eu$ + Ex. 6 + $(Sr, Ca) AlSiN_3:Eu$ |
| Ex. 21 | 390 | $(Sr, Ca, Ba, Mg)_5(PO_4)_3Cl:Eu$ + Ex. 7 + $(Sr, Ca) AlSiN_3:Eu$ |
| Ex. 22 | 392 | $(Sr, Ca, Ba, Mg)_5(PO_4)_3Cl:Eu$ + Ex. 8 + $(Sr, Ca) AlSiN_3:Eu$ |
| Ex. 23 | 389 | $(Sr, Ca, Ba, Mg)_5(PO_4)_3Cl:Eu$ + Ex. 9 + $La_2O_2S:Eu$ |
| Ex. 24 | 392 | $BaMgAl_{10}O_{17}:Eu$ + Ex. 10 + $(Sr,Ca) AlSiN_3:Eu$ |
| Ex. 25 | 392 | $(Sr, Ca, Ba, Mg)_5(PO_4)_3Cl:Eu$ + Ex. 11 + $CaAlSiN_3:Eu$ |
| Ex. 26 | 389 | $(Sr, Ca, Ba, Mg)_5(PO_4)_3Cl:Eu$ + Ex. 14 + $La_2O_2S:Eu$ |

In the light-emitting devices of Examples 16-26, the mixing ratio of the luminescent materials was adjusted to regulate the color temperature thereof to 4200K.

The general color rendering index Ra of the emission devices of Examples 16-26 is summarized in Table 3, below.

TABLE 3

|  | General color rendering index Ra |
|---|---|
| Ex. 16 | 80.1 |
| Ex. 17 | 88.2 |
| Ex. 18 | 93.8 |
| Ex. 19 | 83.2 |
| Ex. 20 | 93.1 |
| Ex. 21 | 94.9 |
| Ex. 22 | 94.0 |
| Ex. 23 | 85.5 |
| Ex. 24 | 92.3 |
| Ex. 25 | 91.2 |
| Ex. 26 | 86.1 |

As shown in the above Table 3, in the case of the white LED devices of Examples, the general color rendering index Ra thereof was always at least 80. Thus, remarkable increase in the general color rendering index will be recognized from the comparison of the light-emitting devices of Examples with the light-emitting device wherein the luminescent material of Comparative Example 1 was employed and where the general color rendering index Ra thereof was only 42.

Further, as shown in Table 4, below, the luminescent material of Example 9, a blue luminescent material and a red luminescent material were employed and then used in combination with an LED chip exhibiting a peak wavelength ranging from 392 to 394 nm, thus realizing the light-emitting devices of Examples 27-30. More specifically, a luminescent material-containing resin was cast to the LED chip mounted on a frame, thus realizing a light-emitting device having a surface-mounting-type structure as shown in FIG. 14. It should be noted that the mixing ratio of the luminescent materials was adjusted to regulate the color temperature of the light-emitting devices to 2800, 3500, 5000 and 6500K.

TABLE 4

|  | Color temp. (K) | Luminescent materials |
|---|---|---|
| Ex. 27 | 2800 | $(Sr, Ca, Ba, Mg)_5(PO_4)_3Cl:Eu + Ex. 9 + La_2O_2S:Eu$ |
| Ex. 28 | 3500 | $(Sr, Ca, Ba, Mg)_5(PO_4)_3Cl:Eu + Ex. 9 + La_2O_2S:Eu$ |
| Ex. 29 | 5000 | $(Sr, Ca, Ba, Mg)_5(PO_4)_3Cl:Eu + Ex. 9 + La_2O_2S:Eu$ |
| Ex. 30 | 6500 | $(Sr, Ca, Ba, Mg)_5(PO_4)_3Cl:Eu + Ex. 9 + La_2O_2S:Eu$ |

The general color rendering index Ra of the light-emitting devices of each of Examples 27-30 is summarized in Table 5, below.

TABLE 5

|  | General color rendering index Ra |
|---|---|
| Ex. 27 | 80.7 |
| Ex. 28 | 83.3 |
| Ex. 29 | 87.2 |
| Ex. 30 | 88.9 |

As shown in Table 5, in the case of the white LED devices of Examples wherein the color temperature was adjusted to the range of 2800 to 6500K, the general color rendering index Ra thereof was at least 80 in all cases. Therefore, these white LED devices can be employed not only for backlighting but also for illumination, thus making possible a light-emitting device which is practicable and excellent in color rendering.

Additionally, the luminescent materials and an LED chip were combined with each other as shown in Table 6, below, thereby realizing the light-emitting devices of Examples 31-33. These light-emitting devices were constructed as shown in FIG. 15 and manufactured in the same manner as described above.

TABLE 6

|  | Peak wavelength of excitation light (nm) | Luminescent materials |
|---|---|---|
| Ex. 31 | 400 | $(Sr, Ca, Ba, Mg)_5(PO_4)_3Cl:Eu +$ Ex. 12 + $(Sr, Ca)_2SiO_4:Eu$ |
| Ex. 32 | 420 | Ex. 12 + $(Sr, Ca)_2SiO_4:Eu +$ $3.5MgO \cdot 0.5MgF_{10} \cdot GeO_2:Eu$ |
| Ex. 33 | 440 | Ex. 12 + $(Sr, Ca)_2SiO_4:Eu +$ $3.5MgO \cdot 0.5MgF_{10} \cdot GeO_2:Eu$ |

The general color rendering index Ra of the light-emitting devices of Examples 31-33 are summarized in Table 7, below.

TABLE 7

|  | General color rendering index Ra |
|---|---|
| Ex. 31 | 82.3 |
| Ex. 32 | 77.2 |
| Ex. 33 | 83.8 |

As shown in Table 7, in the case of the white LED devices of these Examples, the general color rendering index Ra thereof was at least 77 in all cases, thus indicating that these light-emitting devices were sufficiently practicable.

According to the present invention, it is possible to provide a luminescent material which emits light as it is excited by light having an emission peak falling within the range of 360 to 460 nm and to provide a light-emitting device employing such a luminescent material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An yttrium silicon oxynitride luminescent material comprising:
    a crystalline phase including Y, Si, O and N; and
    an activator comprising Tb and Ce, a molar fraction x1 of the Tb based on a total number of moles of Y, Tb and Ce being confined to a range defined by expression 1, below, and a molar fraction y1 of the Ce based on the total number of moles of Y, Tb and Ce being confined to a range defined by expression 2 below;

$$0 < x1 \leq 0.6 \quad \text{expression 1;}$$

$$0 < y1 \leq 0.2 \quad \text{expression 2,}$$

wherein the luminescent material has a composition represented by formula A1, below:

$$(Y_{1-x1-y1}, Tb_{x1}, Ce_{y1})_a Si_b O_c Nd \quad \text{A1}$$

wherein "a," "b," "c" and "d" are confined to the following ranges:

$$1.9 \leq a \leq 2.1 \quad \text{expression 3;}$$

$$2.8 \leq b \leq 3.1 \quad \text{expression 4;}$$

$$2.7 \leq c \leq 3.1 \quad \text{expression 5;}$$

$$3.8 \leq d \leq 4.2 \quad \text{expression 6.}$$

2. The luminescent material according to claim 1, wherein "a" is 2, "b" is 3, "c" is 3 and "d" is 4.

3. The luminescent material according to claim 1, wherein the molar fraction x1 and the molar fraction y1 are confined to meet the following relationship:

$$x1/y1 \geq 1.$$

4. The luminescent material according to claim 1, wherein the molar fraction x1 and the molar fraction y1 are confined to meet the following relationship:

$$1 \leq x1/y1 \leq 100.$$

5. The luminescent material according to claim 1, wherein the molar fraction x1 and the molar fraction y1 are confined to meet the following relationship:

$$2 \leq x1/y1 \leq 80.$$

6. An yttrium silicon oxynitride luminescent material comprising
 a crystalline phase including Y, Si, O, N and M, M being at least one selected from a group consisting of La, Gd, and Lu; and
 an activator comprising Tb and Ce, a molar fraction w2 of the M based on a total number of moles of Y, M, Tb and Ce being confined to a range defined by expression 7, below, a molar fraction x2 of the Tb based on the total number of moles of Y, M, Tb and Ce as defined by expression 8 below, and a molar fraction y2 of the Ce based on the total number of moles of Y, M, Tb and Ce being confined to a range defined by expression 9 below;

$$0.01 < w2 \leq 0.3 \quad \text{expression 7;}$$

$$0 < x2 \leq 0.6 \quad \text{expression 8;}$$

$$0 < y2 \leq 0.2 \quad \text{expression 9,}$$

wherein the luminescent material has a composition represented by formula A2, below:

$$(Y_{1-w2-x2-y2}, M_{w2}, Tb_{x2}, Ce_{y2})_a Si_b O_c N_d \quad (A2)$$

wherein "a", "b", "c" and "d" are confined to the following ranges:

$$1.9 \leq a \leq 2.1 \quad \text{expression 10;}$$

$$2.8 \leq b \leq 3.1 \quad \text{expression 11;}$$

$$2.7 \leq c \leq 3.1 \quad \text{expression 12;}$$

$$3.8 \leq d \leq 4.2 \quad \text{expression 13.}$$

7. The luminescent material according to claim 6, wherein the molar fraction x2 and the molar fraction y2 are confined to meet the following relationship:

$$x2/y2 \geq 1.$$

8. The luminescent material according to claim 6, wherein the molar fraction x2 and the molar fraction y2 are confined to meet the following relationship:

$$1 \leq x2/y2 \leq 100.$$

9. The luminescent material according to claim 6, wherein the molar fraction x2 and the molar fraction y2 are confined to meet the following relationship:

$$2 \leq x2/y2 \leq 80.$$

10. The luminescent material according to claim 6, wherein "a" is 2, "b" is 3, "c" is 3 and "d" is 4.

11. The luminescent material according to claim 6, wherein the M is La.

12. A light-emitting device comprising:
 a light-emitting element emitting light, the light having a main emission peak in a wavelength ranging from 360 to 460 nm; and
 a luminescent layer comprising a first luminescent material and configured to be irradiated with the light, the first luminescent material being formed of the luminescent material claimed in claim 1.

13. The light-emitting device according to claim 12, wherein the luminescent layer further comprises a second luminescent material having a peak wavelength ranging from 580 to 680 nm.

14. The light-emitting device according to claim 13, wherein the luminescent layer further comprises a third luminescent material having a peak wavelength ranging from 430 to 510 nm.

15. A light-emitting device comprising:
 a light-emitting element emitting light, the light having a main emission peak in a wavelength ranging from 360 to 460 nm; and
 a luminescent layer comprising a first luminescent material and configured to be irradiated with the light, the first luminescent material being the luminescent material claimed in claim 6.

16. The light-emitting device according to claim 15, wherein the luminescent layer further comprises a second luminescent material having a peak wavelength ranging from 580 to 680 nm.

17. The light-emitting device according to claim 16, wherein the luminescent layer further comprises a third luminescent material having a peak wavelength ranging from 430 to 510 nm.

\* \* \* \* \*